(12) United States Patent
Watanabe et al.

(10) Patent No.: US 6,885,221 B2
(45) Date of Patent: Apr. 26, 2005

(54) SIGNAL DETECTION APPARATUS, SIGNAL DETECTION METHOD, SIGNAL TRANSMISSION SYSTEM, AND COMPUTER READABLE PROGRAM TO EXECUTE SIGNAL TRANSMISSION

(75) Inventors: Hideaki Watanabe, Kasugai (JP); Hiroko Haraguchi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/896,967

(22) Filed: Jul. 23, 2004

(65) Prior Publication Data

US 2004/0257119 A1 Dec. 23, 2004

Related U.S. Application Data

(62) Division of application No. 09/973,767, filed on Oct. 11, 2001, now Pat. No. 6,788,113.

(30) Foreign Application Priority Data

Jun. 19, 2001 (JP) ........................................ 2001-185040
Jun. 19, 2001 (JP) ........................................ 2001-185309

(51) Int. Cl.[7] ................................................ H03K 5/22
(52) U.S. Cl. ........................................ 327/23; 327/24
(58) Field of Search ............................. 327/18, 23, 24, 327/63–65

(56) References Cited

U.S. PATENT DOCUMENTS

| | | | |
|---|---|---|---|
| 3,947,637 A | 3/1976 | Selci et al. | |
| 4,667,164 A | 5/1987 | Doluca | |
| 6,023,196 A | 2/2000 | Ashby et al. | |
| 6,060,956 A | 5/2000 | Mole et al. | |
| 6,094,571 A | 7/2000 | Groe | |
| 6,104,226 A | 8/2000 | Weber | |
| 6,259,321 B1 | 7/2001 | Song et al. | |
| 6,363,025 B1 * | 3/2002 | McLaury | 365/226 |
| 6,441,659 B1 * | 8/2002 | Demone | 327/156 |
| 6,794,922 B1 * | 9/2004 | Mashimo | 327/336 |

* cited by examiner

*Primary Examiner*—Kenneth B. Wells
(74) *Attorney, Agent, or Firm*—Staas & Halsey, LLP

(57) ABSTRACT

In a differential output signal circuit suitable for restraining voltage overshooting/undershooting at differential output terminals due to lags in input signals and realizing stable and fast switching of differential input signals, a first differential pair of PMOS. transistors connected to a first current source and a second differential pair of NMOS transistors connected to a second current source are mutually connected at the differential output terminals, and a capacitor is connected between the connection nodes of the respective differential pairs and current sources. A transitional current path of the capacitor restrains voltage variations during differential input signal switching. Further in a signal detection apparatus suitable for realizing the detection of fast transmitted differential input signals with less current consumption and at low cost, an edge detect signal is supplied against a differential input of or above a prescribed value, and a setting signal is issued when this edge detect signal has been detected a prescribed number of times during a first prescribed length of time while a resetting signal is issued if none is detected during a second prescribed length of time. A signal-detect signal is generated from these setting signal and resetting signal.

20 Claims, 24 Drawing Sheets

DIFFERENTIAL SIGNAL OUTPUT CIRCUIT IN FIRST EMBODIMENT

DIFFERENTIAL SIGNAL OUTPUT CIRCUIT IN FIRST EMBODIMENT

EXAMPLE OF CURRENT SOURCE IN FIRST EMBODIMENT

SPECIFIC EXAMPLE OF CAPACITOR IN FIRST EMBODIMENT

SPECIFIC EXAMPLE IN FIRST EMBODIMENT

DIFFERENTIAL OUTPUT WAVEFORMS ACCORDING TO RESULT
OF SIMULATION OF SPECIFIC EXAMPLE OF FIRST EMBODIMENT
PRIOR ART

FIRST EMBODIMENT

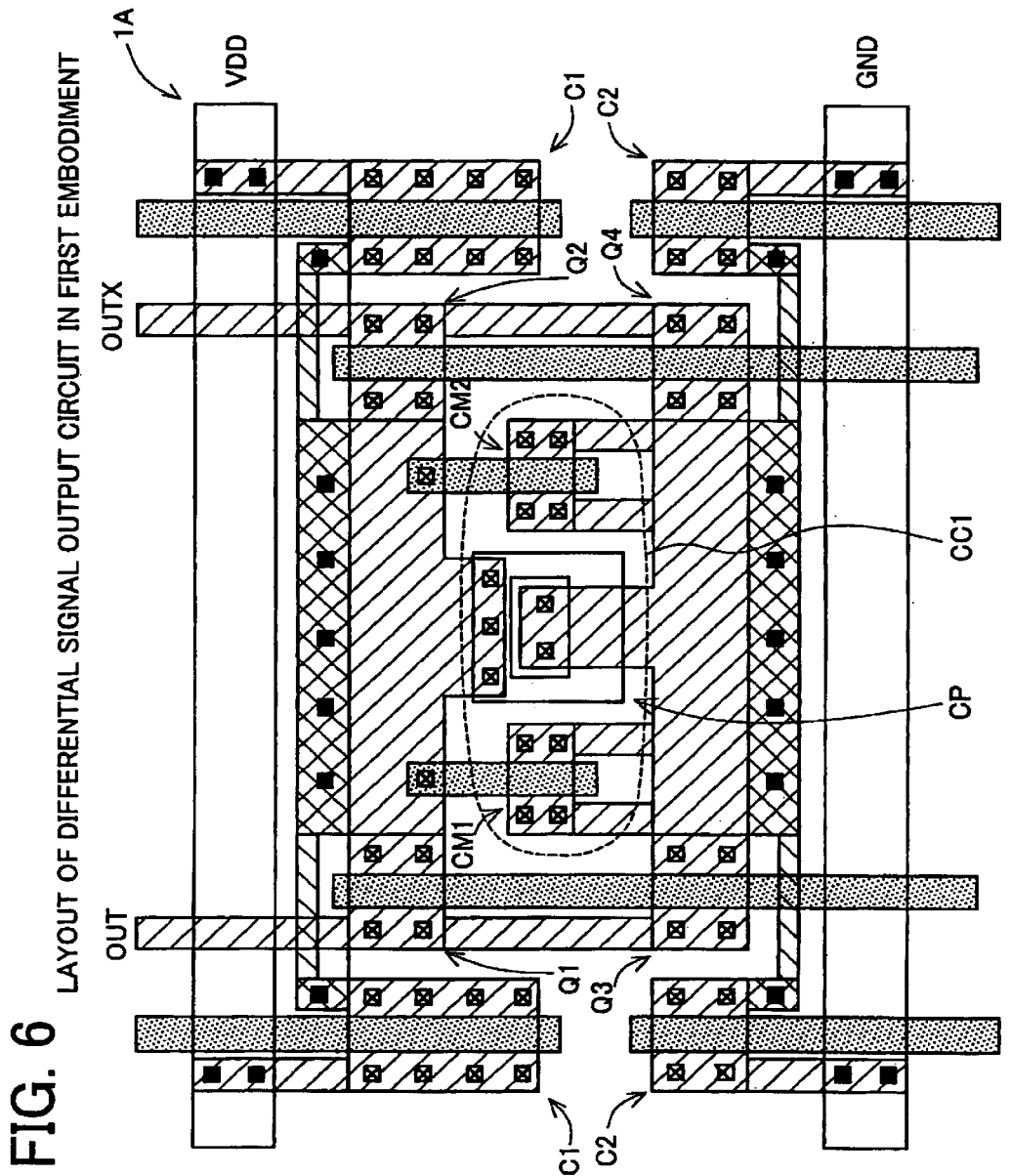
FIG. 6  LAYOUT OF DIFFERENTIAL SIGNAL OUTPUT CIRCUIT IN FIRST EMBODIMENT

DIFFERENTIAL SIGNAL OUTPUT CIRCUIT IN SECOND EMBODIMENT

CIRCUIT STRUCTURED WITH PASSIVE LOADS

CIRCUIT STRUCTURED WITH ACTIVE LOADS

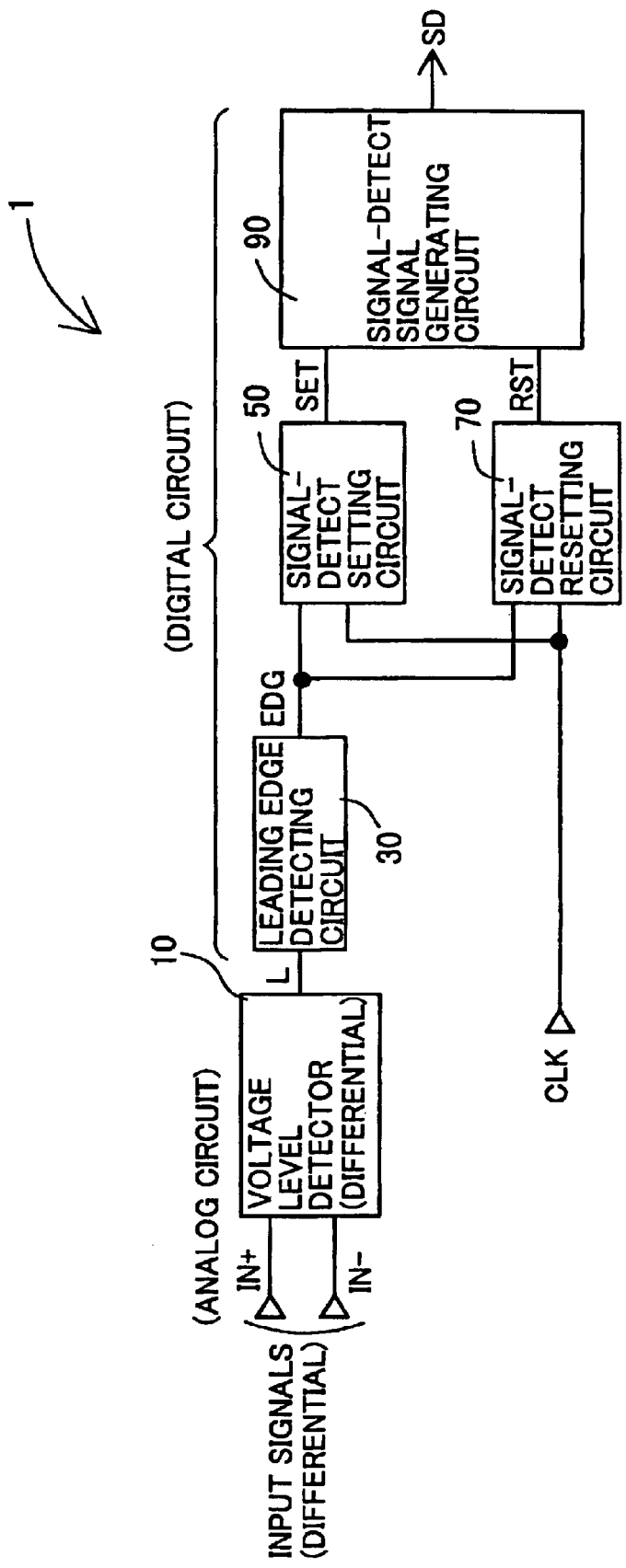
FIG. 8 BLOCK DIAGRAM ILLUSTRATING SIGNAL DETECTION APPARATUS IN THIRD EMBODIMENT TIMING PARAMETERS OF SIGNAL-DETECT SIGNALS ACCORDING TO P1394b STANDARD

| SYMBOL | PARAMETER | UNIT | MIN. | MAX. |
|---|---|---|---|---|
| t_sd_on | DELAY TIME FROM DETECTION OF A VALID SIGNAL UNTIL ASSERTION OF A SIGNAL-DETECT SIGNAL | μ sec | — | 100 |
| t_sd_off | DELAY TIME FROM DETECTION OF AN INVALID SIGNAL UNTIL NAGATION OF A SIGNAL-DETECT SIGNAL | μ sec | — | t_sd_on |

FIG. 10 CODE TABLE(1)
8b10bCODES ACCORDING TO P1394b STANDARD

| INPUT | | ABCDEI FGHJ OUTPUT | | INPUT | | ABCDEI FGHJ OUTPUT | |
|---|---|---|---|---|---|---|---|
| NAME | A'B'C'D'E'F'G'H' | RD<0 | RD>0 | NAME | A'B'C'D'E'F'G'H' | RD<0 | RD>0 |
| | I | DATA_TABLE[I][0] | DATA_TABLE[I][1] | | I | DATA_TABLE[I][0] | DATA_TABLE[I][1] |
| D0.0 | 00000000 | 1001110100 | 0110001011 | D4.0 | 00100000 | 1101010100 | 0010101011 |
| D0.4 | 00000001 | 1001110010 | 0110001101 | D4.4 | 00100001 | 1101010010 | 0010101101 |
| D0.2 | 00000010 | 1001110101 | 0110000101 | D4.2 | 00100010 | 1101010101 | 0010100101 |
| D0.6 | 00000011 | 1001110110 | 0110000110 | D4.6 | 00100011 | 1101010110 | 0010100110 |
| D0.1 | 00000100 | 1001111001 | 0110001001 | D4.1 | 00100100 | 1101011001 | 0010101001 |
| D0.5 | 00000101 | 1001111010 | 0110001010 | D4.5 | 00100101 | 1101011010 | 0010101010 |
| D0.3 | 00000110 | 1001110011 | 0110001100 | D4.3 | 00100110 | 1101010011 | 0010101100 |
| D0.7 | 00000111 | 1001110001 | 0110001110 | D4.7 | 00100111 | 1101010001 | 0010101110 |
| D16.0 | 00001000 | 0110110100 | 1001001011 | D20.0 | 00101000 | 0010111011 | 0010110100 |
| D16.4 | 00001001 | 0110110010 | 1001001101 | D20.4 | 00101001 | 0010111101 | 0010110010 |
| D16.2 | 00001010 | 0110110101 | 1001000101 | D20.2 | 00101010 | 0010110101 | 0010110101 |
| D16.6 | 00001011 | 0110110110 | 1001000110 | D20.6 | 00101011 | 0010110110 | 0010110110 |
| D16.1 | 00001100 | 0110111001 | 1001001001 | D20.1 | 00101100 | 0010111001 | 0010111001 |
| D16.5 | 00001101 | 0110111010 | 1001001010 | D20.5 | 00101101 | 0010111010 | 0010111010 |
| D16.3 | 00001110 | 0110110011 | 1001001100 | D20.3 | 00101110 | 0010111100 | 0010110011 |
| D16.7 | 00001111 | 0110110001 | 1001001110 | D20.7 | 00101111 | 0010110111 | 0010110001 |
| D8.0 | 00010000 | 1110010100 | 0001101011 | D12.0 | 00110000 | 0011101011 | 0011010100 |
| D8.4 | 00010001 | 1110010010 | 0001101101 | D12.4 | 00110001 | 0011011101 | 0011010010 |
| D8.2 | 00010010 | 1110010101 | 0001100101 | D12.2 | 00110010 | 0011010101 | 0011010101 |
| D8.6 | 00010011 | 1110010110 | 0001100110 | D12.6 | 00110011 | 0011010110 | 0011010110 |
| D8.1 | 00010100 | 1110011001 | 0001101001 | D12.1 | 00110100 | 0011011001 | 0011011001 |
| D8.5 | 00010101 | 1110011010 | 0001101010 | D12.5 | 00110101 | 0011011010 | 0011011010 |
| D8.3 | 00010110 | 1110010011 | 0001101100 | D12.3 | 00110110 | 0011011100 | 0011010011 |
| D8.7 | 00010111 | 1110010001 | 0001101110 | D12.7 | 00110111 | 0011011110 | 0011010001 |
| D24.0 | 00011000 | 1100110100 | 0011001011 | D28.0 | 00111000 | 0011101011 | 0011100100 |
| D24.4 | 00011001 | 1100110010 | 0011001101 | D28.4 | 00111001 | 0011101101 | 0011100010 |
| D24.2 | 00011010 | 1100110101 | 0011000101 | D28.2 | 00111010 | 0011100101 | 0011100101 |
| D24.6 | 00011011 | 1100110110 | 0011000110 | D28.6 | 00111011 | 0011100110 | 0011100110 |
| D24.1 | 00011100 | 1100111001 | 0011001001 | D28.1 | 00111100 | 0011101001 | 0011101001 |
| D24.5 | 00011101 | 1100111010 | 0011001010 | D28.5 | 00111101 | 0011101010 | 0011101010 |
| D24.3 | 00011110 | 1100110011 | 0011001100 | D28.3 | 00111110 | 0011101100 | 0011100011 |
| D24.7 | 00011111 | 1100110001 | 0011001110 | D28.7 | 00111111 | 0011101110 | 0011100001 |
| D2.0 | 01000000 | 1011010100 | 0100101011 | D6.0 | 01100000 | 0110011011 | 0110010100 |
| D2.4 | 01000001 | 1011010010 | 0100101101 | D6.4 | 01100001 | 0110011101 | 0110010010 |
| D2.2 | 01000010 | 1011010101 | 0100100101 | D6.2 | 01100010 | 0110010101 | 0110010101 |
| D2.6 | 01000011 | 1011010110 | 0100100110 | D6.6 | 01100011 | 0110010110 | 0110010110 |
| D2.1 | 01000100 | 1011011001 | 0100101001 | D6.1 | 01100100 | 0110011001 | 0110011001 |
| D2.5 | 01000101 | 1011011010 | 0100101010 | D6.5 | 01100101 | 0110011010 | 0110011010 |
| D2.3 | 01000110 | 1011010011 | 0100101100 | D6.3 | 01100110 | 0110011100 | 0110010011 |
| D2.7 | 01000111 | 1011010001 | 0100101110 | D6.7 | 01100111 | 0110011110 | 0110010001 |
| D18.0 | 01001000 | 0100111011 | 0100110100 | D22.0 | 01101000 | 0110101011 | 0110100100 |
| D18.4 | 01001001 | 0100111101 | 0100110010 | D22.4 | 01101001 | 0110101101 | 0110100010 |
| D18.2 | 01001010 | 0100110101 | 0100110101 | D22.2 | 01101010 | 0110101010 | 0110100101 |
| D18.6 | 01001011 | 0100110110 | 0100110110 | D22.6 | 01101011 | 0110100110 | 0110100110 |
| D18.1 | 01001100 | 0100111001 | 0100111001 | D22.1 | 01101100 | 0110101001 | 0110101001 |
| D18.5 | 01001101 | 0100111010 | 0100111010 | D22.5 | 01101101 | 0110101101 | 0110101010 |
| D18.3 | 01001110 | 0100111100 | 0100110011 | D22.3 | 01101110 | 0110101100 | 0110100011 |
| D18.7 | 01001111 | 0100110111 | 0100110001 | D22.7 | 01101111 | 0110101110 | 0110100001 |
| D10.0 | 01010000 | 0101011011 | 0101010100 | D14.0 | 01110000 | 0111001011 | 0111000100 |
| D10.4 | 01010001 | 0101011101 | 0101010010 | D14.4 | 01110001 | 0111001101 | 0111000010 |
| D10.2 | 01010010 | 0101010101 | 0101010101 | D14.2 | 01110010 | 0111000101 | 0111000101 |
| D10.6 | 01010011 | 0101010110 | 0101010110 | D14.6 | 01110011 | 0111000110 | 0111000110 |
| D10.1 | 01010100 | 0101011001 | 0101011001 | D14.1 | 01110100 | 0111001001 | 0111001001 |
| D10.5 | 01010101 | 0101011010 | 0101011010 | D14.5 | 01110101 | 0111001010 | 0111001010 |
| D10.3 | 01010110 | 0101011100 | 0101010011 | D14.3 | 01110110 | 0111001100 | 0111000011 |
| D10.7 | 01010111 | 0101011110 | 0101010001 | D14.7 | 01110111 | 0111001110 | 0111001000 |
| D26.0 | 01011000 | 0101101011 | 0101100100 | D30.0 | 01111000 | 0111100100 | 1000011011 |
| D26.4 | 01011001 | 0101101101 | 0101100010 | D30.4 | 01111001 | 0111101001 | 1000011101 |
| D26.2 | 01011010 | 0101100101 | 0101100101 | D30.2 | 01111010 | 0111100101 | 1000010101 |
| D26.6 | 01011011 | 0101100110 | 0101100110 | D30.6 | 01111011 | 0111101110 | 1000010110 |
| D26.1 | 01011100 | 0101101001 | 0101101001 | D30.1 | 01111100 | 0111101001 | 1000011001 |
| D26.5 | 01011101 | 0101101101 | 0101101010 | D30.5 | 01111101 | 0111101101 | 1000011010 |
| D26.3 | 01011110 | 0101101100 | 0101100011 | D30.3 | 01111110 | 0111100011 | 1000011100 |
| D26.7 | 01011111 | 0101101110 | 0101100001 | D30.7 | 01111111 | 0111100001 | 1000011110 |
| D1.0 | 10000000 | 0111010100 | 1000101011 | D5.0 | 10100000 | 1010011011 | 1010010100 |
| D1.4 | 10000001 | 0111010010 | 1000101101 | D5.4 | 10100001 | 1010011101 | 1010010010 |
| D1.2 | 10000010 | 0111010101 | 1000100101 | D5.2 | 10100010 | 1010010101 | 1010010101 |
| D1.6 | 10000011 | 0111010110 | 1000100110 | D5.6 | 10100011 | 1010010110 | 1010010110 |

FIG. 11

CODE TABLE(2)
8b10bCODES ACCORDING TO P1394b STANDARD

| INPUT | | ABCDEI FGHJ OUTPUT | | INPUT | | ABCDEI FGHJ OUTPUT | |
|---|---|---|---|---|---|---|---|
| NAME | A'B'C'D'E'F'G'H' | RD<0 | RD>0 | NAME | A'B'C'D'E'F'G'H' | RD<0 | RD>0 |
| | i | DATA_TABLE[i][0] | DATA_TABLE[i][1] | | i | DATA_TABLE[i][0] | DATA_TABLE[i][1] |
| D1.1 | 10000100 | 0111011001 | 1000101001 | D5.1 | 10100100 | 1010011001 | 1010011001 |
| D1.5 | 10000101 | 0111011010 | 1000101010 | D5.5 | 10100101 | 1010011010 | 1010011010 |
| D1.3 | 10000110 | 0111010011 | 1000101100 | D5.3 | 10100110 | 1010011100 | 1010010011 |
| D1.7 | 10000111 | 0111010001 | 1000101110 | D5.7 | 10100111 | 1010011110 | 1010010001 |
| D17.0 | 10001000 | 1000111011 | 1000110100 | D21.0 | 10101000 | 1010101011 | 1010100100 |
| D17.4 | 10001001 | 1000111101 | 1000110010 | D21.4 | 10101001 | 1010101101 | 1010100010 |
| D17.2 | 10001010 | 1000110101 | 1000110101 | D21.2 | 10101010 | | |
| D17.6 | 10001011 | 1000110110 | 1000110110 | D21.6 | 10101011 | 1010100110 | 1010100110 |
| D17.1 | 10001100 | 1000111001 | 1000111001 | D21.1 | 10101100 | | |
| D17.5 | 10001101 | 1000111010 | 1000111010 | D21.5 | 10101101 | | |
| D17.3 | 10001110 | 1000111100 | 1000110011 | D21.3 | 10101110 | 1010101100 | 1010100011 |
| D17.7 | 10001111 | 1000110111 | 1000110001 | D21.7 | 10101111 | 1010101110 | 1010100001 |
| D9.0 | 10010000 | 1001011011 | 1001010100 | D13.0 | 10110000 | 1011001011 | 1011000100 |
| D9.4 | 10010001 | 1001011101 | 1001010010 | D13.4 | 10110001 | 1011001101 | 1011000010 |
| D9.2 | 10010010 | | | D13.2 | 10110010 | 1011000101 | 1011000101 |
| D9.6 | 10010011 | 1001010110 | 1001000110 | D13.6 | 10110011 | 1011000110 | 1011000110 |
| D9.1 | 10010100 | 1001011001 | 1001011001 | D13.1 | 10110100 | 1011001001 | 1011001001 |
| D9.5 | 10010101 | 1001011010 | 1001011010 | D13.5 | 10110101 | 1011001010 | 1011001010 |
| D9.3 | 10010110 | 1001011100 | 1001010011 | D13.3 | 10110110 | 1011001100 | 1011000011 |
| D9.7 | 10010111 | 1001011110 | 1001010001 | D13.7 | 10110111 | 1011001110 | 1011001000 |
| D25.0 | 10011000 | 1001101011 | 1001100100 | D29.0 | 10111000 | 1011100100 | 0100011011 |
| D25.4 | 10011001 | 1001101101 | 1001100010 | D29.4 | 10111001 | 1011100010 | 0100011101 |
| D25.2 | 10011010 | 1001100101 | 1001100101 | D29.2 | 10111010 | 1011100101 | 0100010101 |
| D25.6 | 10011011 | 1001100110 | 1001100110 | D29.6 | 10111011 | 1011100110 | 0100010110 |
| D25.1 | 10011100 | 1001101001 | 1001101001 | D29.1 | 10111100 | 1011101001 | 0100011001 |
| D25.5 | 10011101 | 1001101010 | 1001101010 | D29.5 | 10111101 | 1011101010 | 0100011010 |
| D25.3 | 10011110 | 1001101100 | 1001100011 | D29.3 | 10111110 | 1011100011 | 0100011100 |
| D25.7 | 10011111 | 1001101110 | 1001100001 | D29.7 | 10111111 | 1011101110 | 0100011111 |
| D3.0 | 11000000 | 1100011011 | 1100010100 | D7.0 | 11100000 | 1110001011 | 0001110100 |
| D3.4 | 11000001 | 1100011101 | 1100010010 | D7.4 | 11100001 | 1110001101 | 0001110010 |
| D3.2 | 11000010 | 1100010101 | 1100010101 | D7.2 | 11100010 | 1110000101 | 0001110101 |
| D3.6 | 11000011 | 1100010110 | 1100010110 | D7.6 | 11100011 | 1110000110 | 0001110110 |
| D3.1 | 11000100 | 1100011001 | 1100011001 | D7.1 | 11100100 | 1110001001 | 0001111001 |
| D3.5 | 11000101 | 1100011010 | 1100011010 | D7.5 | 11100101 | 1110001010 | 0001111010 |
| D3.3 | 11000110 | 1100011100 | 1100010011 | D7.3 | 11100110 | 1110001100 | 0001110011 |
| D3.7 | 11000111 | 1100011110 | 1100010001 | D7.7 | 11100111 | 1110001110 | 0001110001 |
| D19.0 | 11001000 | 1100101011 | 1100100100 | D23.0 | 11101000 | 1110100100 | 0001011011 |
| D19.4 | 11001001 | 1100101101 | 1100100010 | D23.4 | 11101001 | 1110100010 | 0001011101 |
| D19.2 | 11001010 | 1100100101 | 1100100101 | D23.2 | 11101010 | 1110100101 | 0001010101 |
| D19.6 | 11001011 | 1100100110 | 1100100110 | D23.6 | 11101011 | 1110100110 | 0001010110 |
| D19.1 | 11001100 | 1100101001 | 1100101001 | D23.1 | 11101100 | 1110101001 | 0001011001 |
| D19.5 | 11001101 | 1100101010 | 1100101010 | D23.5 | 11101101 | 1110101010 | 0001011010 |
| D19.3 | 11001110 | 1100101100 | 1100100011 | D23.3 | 11101110 | 1110100011 | 0001011100 |
| D19.7 | 11001111 | 1100101110 | 1100100001 | D23.7 | 11101111 | 1110100001 | 0001011110 |
| D11.0 | 11010000 | 1101001011 | 1101000100 | D15.0 | 11110000 | 0101110100 | 1010001011 |
| D11.4 | 11010001 | 1101001101 | 1101000010 | D15.4 | 11110001 | 0101110010 | 1010001101 |
| D11.2 | 11010010 | 1101000101 | 1101000101 | D15.2 | 11110010 | 0101110101 | 1010000101 |
| D11.6 | 11010011 | 1101000110 | 1101000110 | D15.6 | 11110011 | 0101110110 | 1010000110 |
| D11.1 | 11010100 | 1101001001 | 1101001001 | D15.1 | 11110100 | 0101111001 | 1010001001 |
| D11.5 | 11010101 | 1101001010 | 1101001010 | D15.5 | 11110101 | 0101111010 | 1010001010 |
| D11.3 | 11010110 | 1101001100 | 1101000011 | D15.3 | 11110110 | 0101110011 | 1010001100 |
| D11.7 | 11010111 | 1101001110 | 1101001000 | D15.7 | 11110111 | 0101110001 | 1010001110 |
| D27.0 | 11011000 | 1101100100 | 0010011011 | D31.0 | 11111000 | 1010110100 | 0101001011 |
| D27.4 | 11011001 | 1101100010 | 0010011101 | D31.4 | 11111001 | 1010110010 | 0101001101 |
| D27.2 | 11011010 | 1101100101 | 0010010101 | D31.2 | 11111010 | 1010110101 | 0101000101 |
| D27.6 | 11011011 | 1101100110 | 0010010110 | D31.6 | 11111011 | 1010110110 | 0101000110 |
| D27.1 | 11011100 | 1101101001 | 0010011001 | D31.1 | 11111100 | 1010111001 | 0101001001 |
| D27.5 | 11011101 | 1101101010 | 0010011010 | D31.5 | 11111101 | 1010111010 | 0101001010 |
| D27.3 | 11011110 | 1101100011 | 0010011100 | D31.3 | 11111110 | 1010110011 | 0101001100 |
| D27.7 | 11011111 | 1101100001 | 0010011110 | D31.7 | 11111111 | 1010110001 | 0101001110 |

SPECIFIC EXAMPLE VOLTAGE LEVEL DETECTOR IN THIRD EMBODIMENT

FIG. 13 SPECIFIC EXAMPLE OF SIGNAL-DETECT SETTING CIRCUIT IN THIRD EMBODIMENT

SPECIFIC EXAMPLE OF SIGNAL-DETECT RESETTING CIRCUIT IN THIRD EMBODIMENT

FIG. 15 SIGNAL-DETECT SIGNAL SETTING SEQUENCE
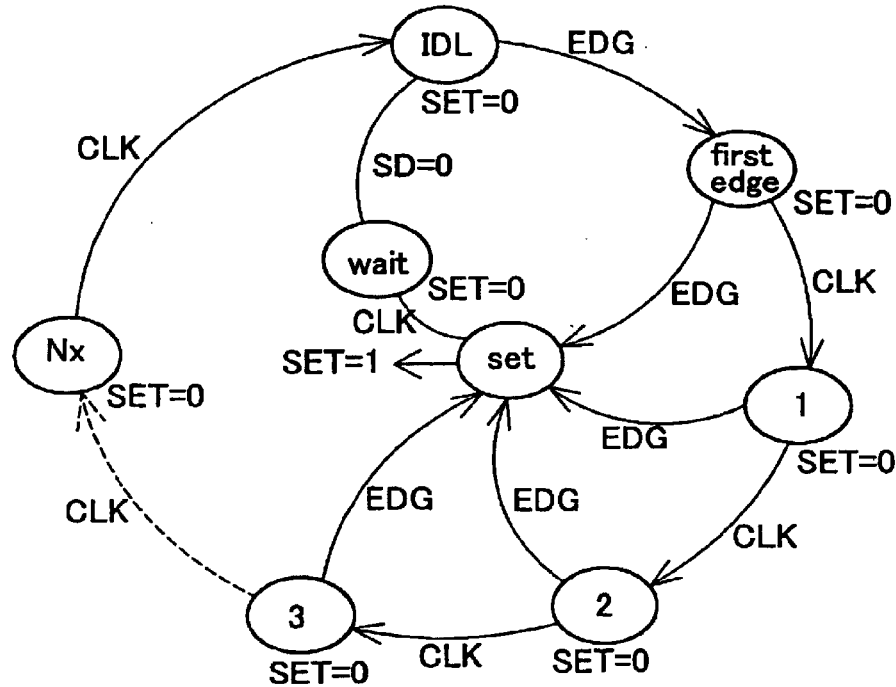
FIG. 16 SIGNAL-DETECT SIGNAL RESETTING SEQUENCE
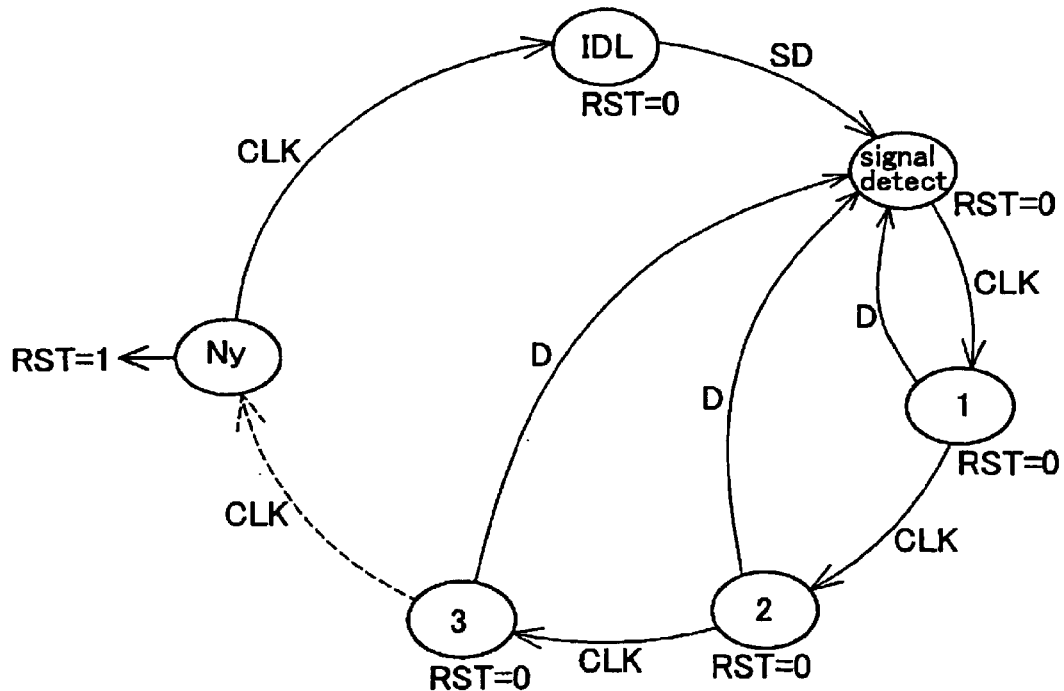

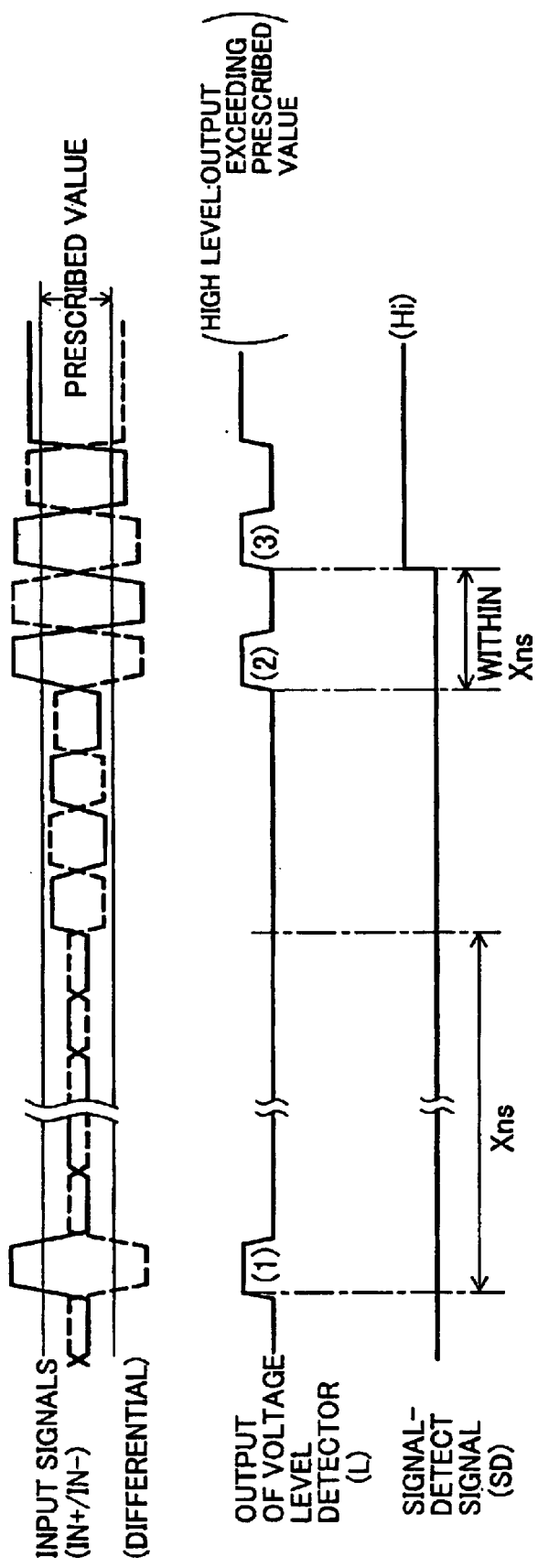
FIG. 17 TIME CHART SHOWING SIGNAL-DETECT SIGNAL SETTING SEQUENCE

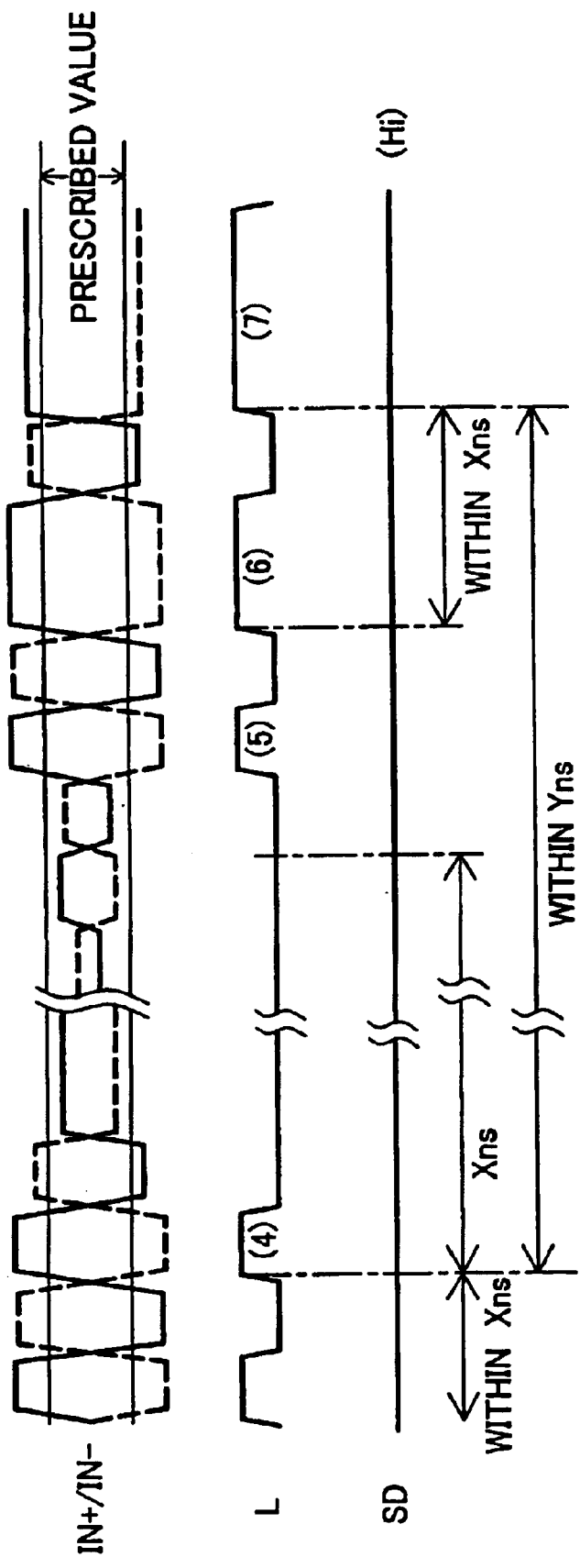
FIG. 18 TIME CHART SHOWING ACTIONS DURING SIGNAL-DETECT SIGNAL SETTING

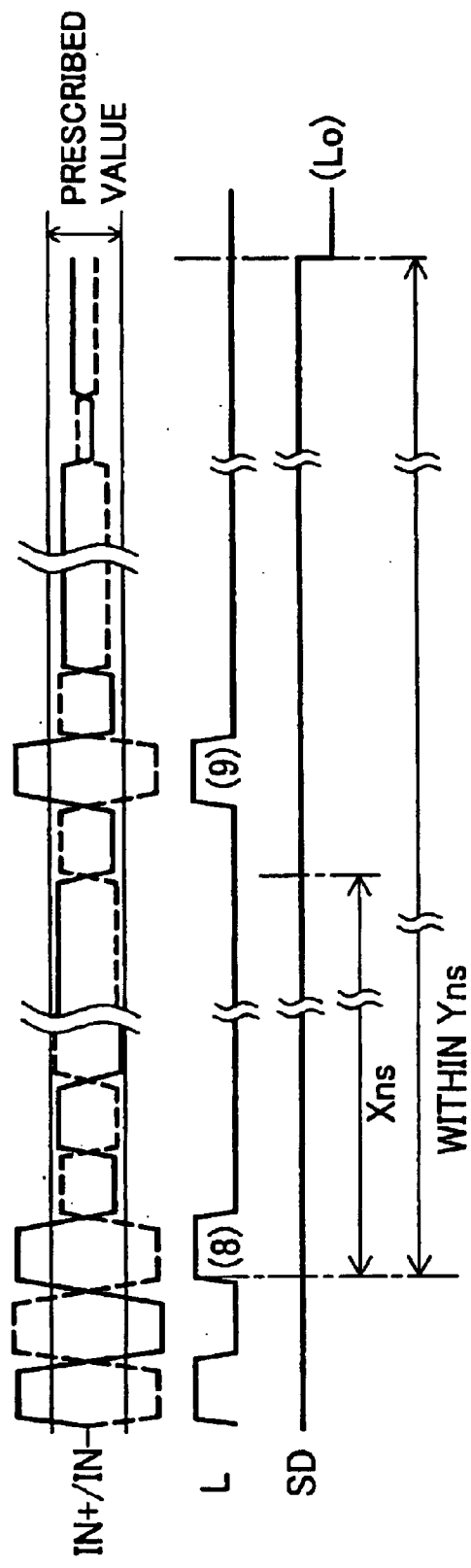
FIG. 19 TIME CHART SHOWING SIGNAL-DETECT SIGNAL RESETTING SEQUENCE

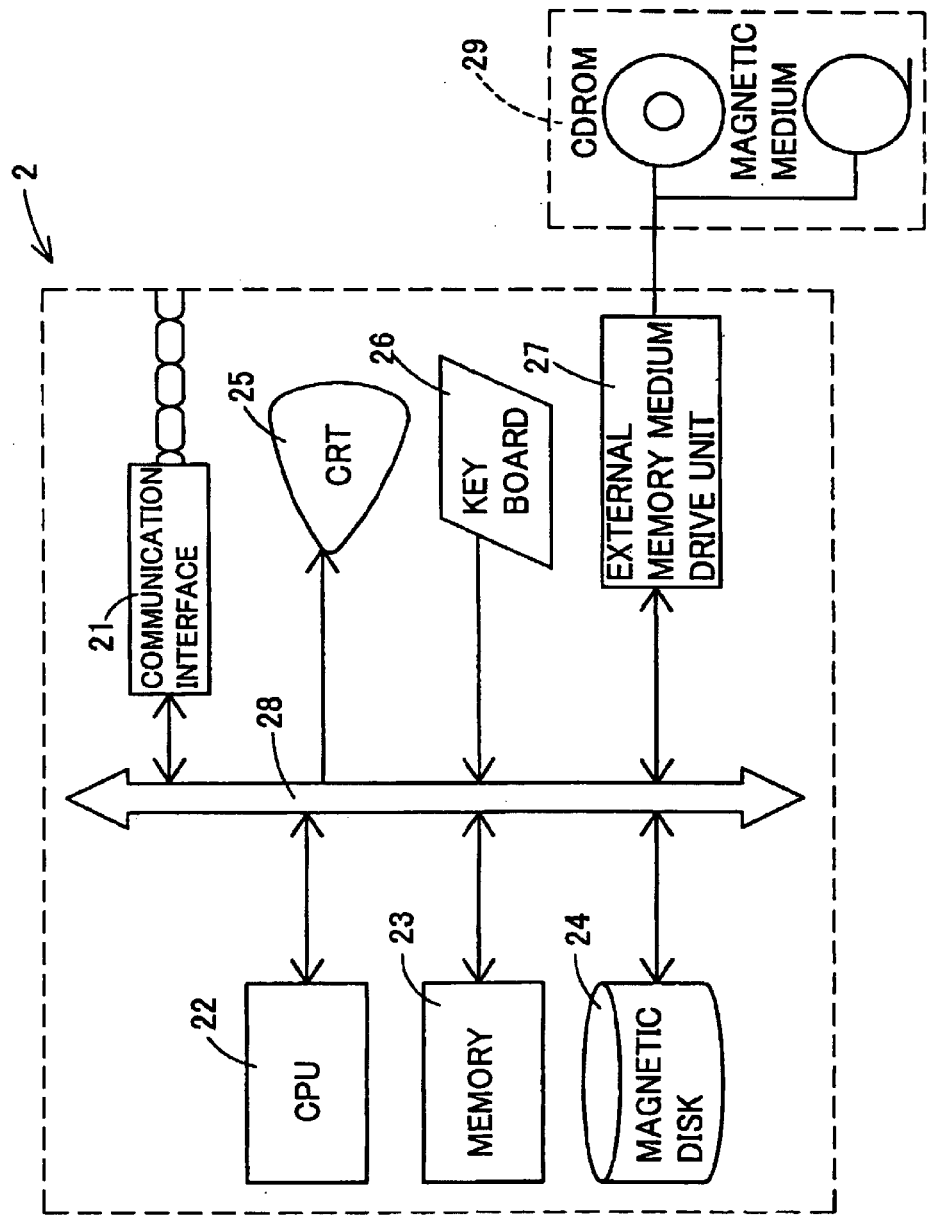
FIG. 20 CONFIGURATIONAL DIAGRAM OF SIGNAL DETECTION APPARATUS IN FOURTH EMBODIMENT

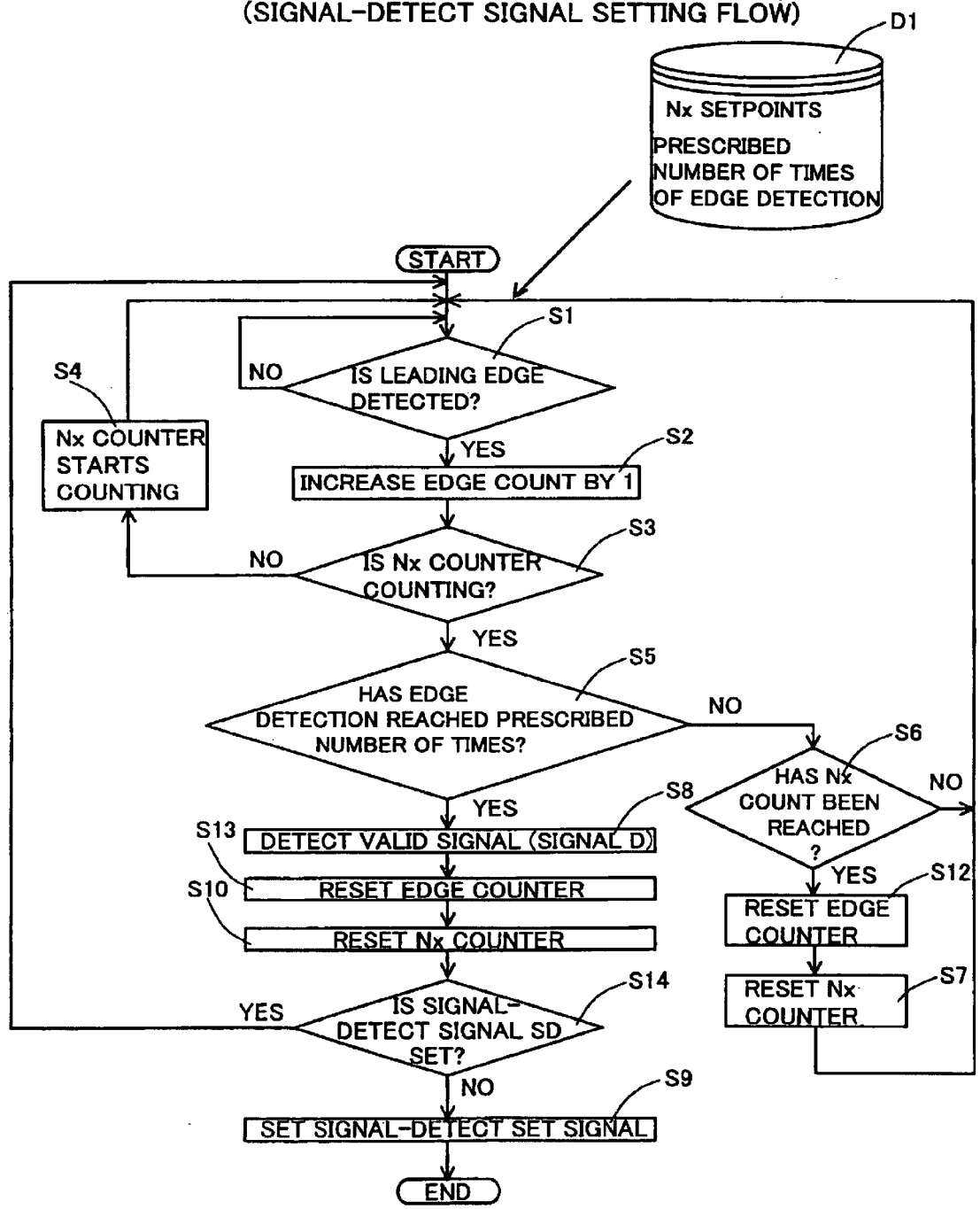
FIG. 21 SIGNAL DETECTION METHOD EXECUTED BY SIGNAL DETECTION APPARATUS IN FOURTH EMBODIMENT (SIGNAL-DETECT SIGNAL SETTING FLOW)

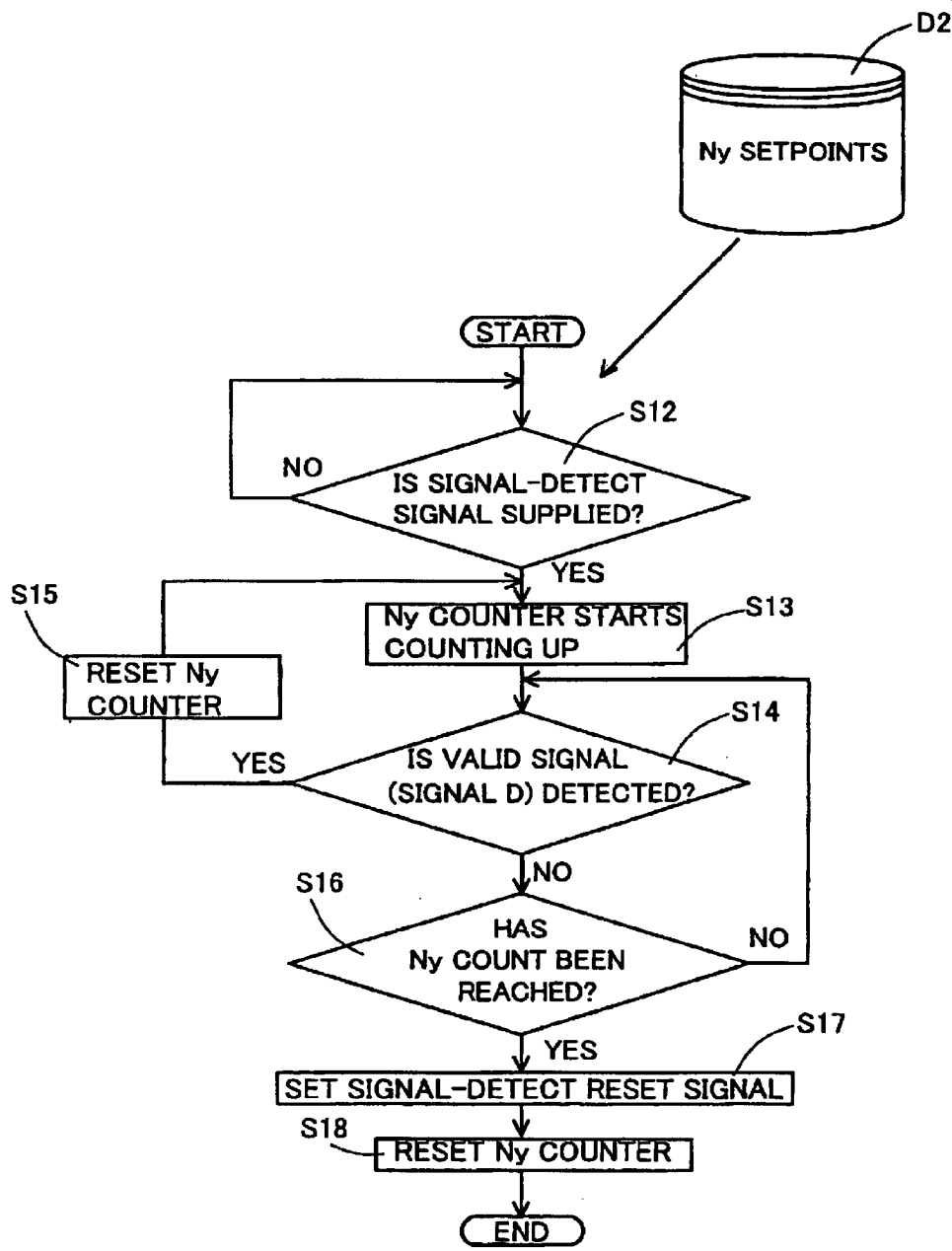
FIG. 22 SIGNAL DETECTION METHOD EXECUTED BY SIGNAL DETECTION APPARATUS IN FOURTH EMBODIMENT (SIGNAL-DETECT SIGNAL RESETTING FLOW)

EXAMPLE OF DIFFERENTIAL SIGNAL TRANSMISSION SYSTEM

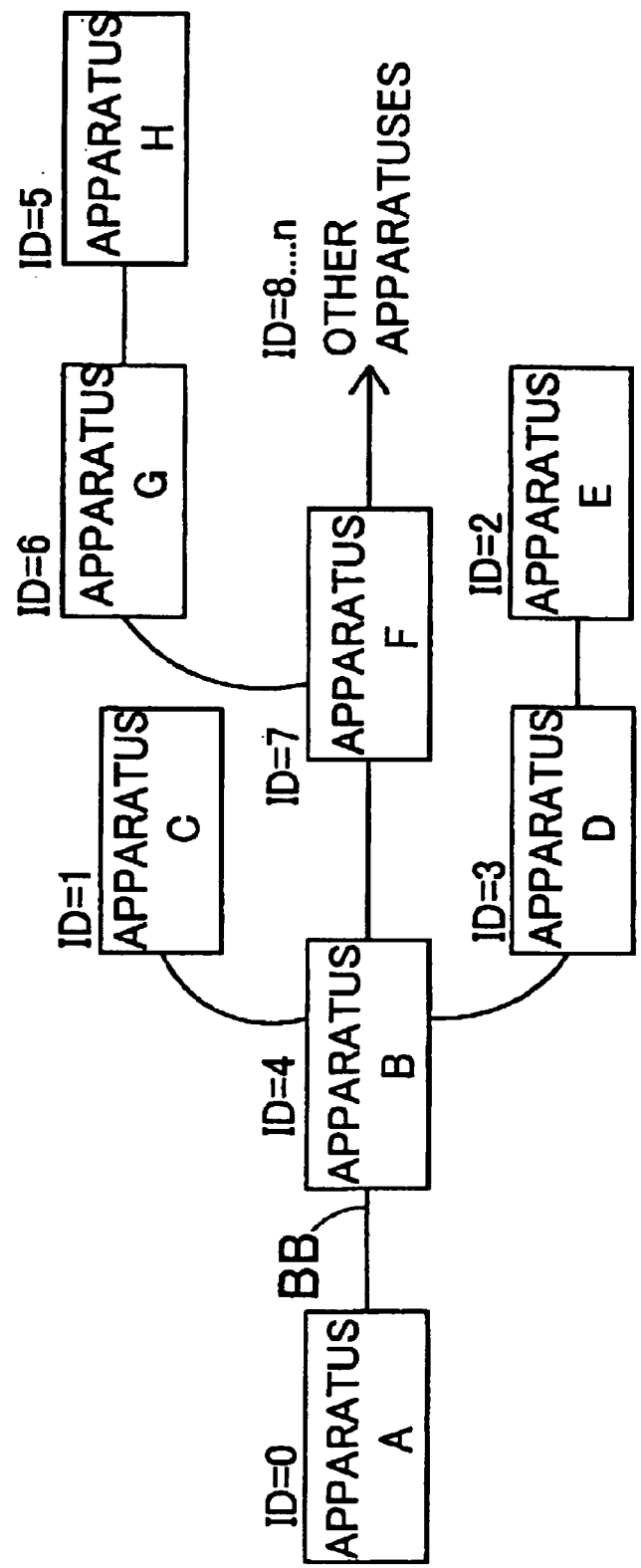
FIG. 24 EXAMPLE OF SIGNAL TRANSMISSION SYSTEM CONFIGULATION

FIG. 25          PRIOR ART
DIFFERENTIAL SIGNAL OUTPUT CIRCUIT ACCORDING
TO PRIOR ART
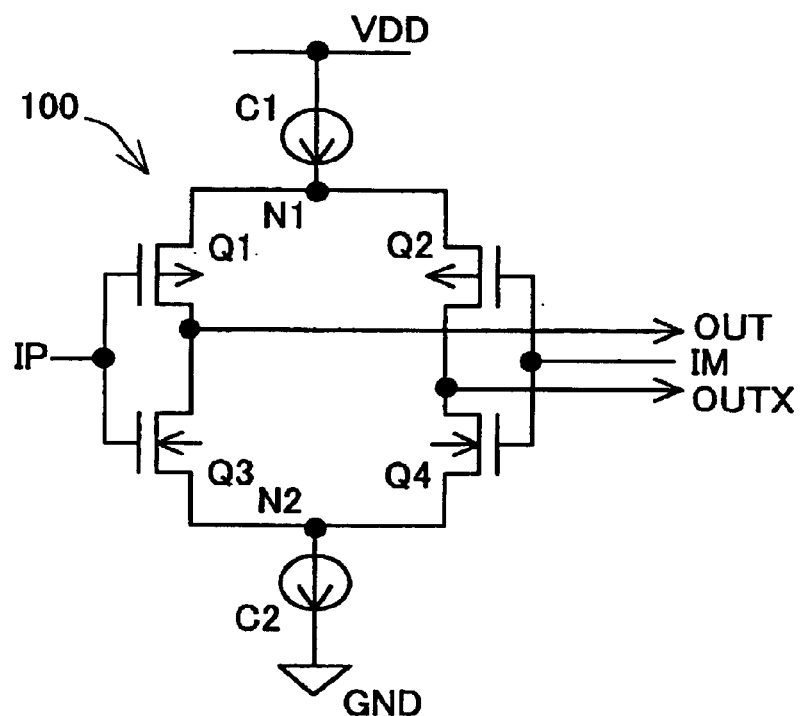

ANOTHER DIFFERENTIAL SIGNAL OUTPUT CIRCUIT ACCORDING TO PRIOR ART

CIRCUIT WITH PASSIVE LOADS

CIRCUIT WITH ACTIVE LOADS

SIGNAL DETECTION APPARATUS ACCORDING TO PRIOR ART

SIGNAL DETECTION APPARATUS, SIGNAL DETECTION METHOD, SIGNAL TRANSMISSION SYSTEM, AND COMPUTER READABLE PROGRAM TO EXECUTE SIGNAL TRANSMISSION

CROSS-REFERENCE TO RELATED APPLICATION

This application is a Divisional of application Ser. No. 09/973,767, filed Oct. 11, 2001, now U.S. Pat. No. 6,788, 113. This application is based upon and claims the priority of U.S. application Ser. No. 09/973,767, and Japanese application Nos. 2001-185309 filed Jun. 19, 2001, and 2001-185040 filed Jun. 19, 2001, the contents being incorporated herein by reference.

BACKGROUND OF THE INVENTION

1. Field of the Invention

The present invention relates to a differential signal output apparatus for interface signals outputted as differential signals on a transmission line in digital interfacing for serial communication and determination of the presence/absence of transmitted interface signals, and more particularly to a differential signal output apparatus and determination of the presence/absence of transmitted interface signals suitably usable for serial communicating having a high speed digital interface.

2. Description of the Related Art

According to the prior art, in high speed serial communication, typically represented by IEEE 1394 serial bus, differential signals are transmitted using a coaxial cable or a twisted pair cable as the transmission line. These differential signals have a differential amplitude of about 200 mV and a maximum data transfer rate of as fast as 400 megabits/sec according to the IEEE 1394-1995 standard, for instance.

Further in recent years, the P1394b standard is being formulated to realize high speed transmission over a long transmission distance as the next generation standard of IEEE 1394, as the voltage amplitude level of differential input signals and the like transmitted over a twisted pair cable or some other transmission line, high speed data transmission of about 800 mV in differential amplitude and 800 megabits/sec in maximum data transfer rate has come to be required, and circuit configurations with enhanced drive capacities for differential output signals to realize this high speed transmission are being devised.

According to the P1394b standard, there is required a signal detection circuit which detects the voltage amplitude level of differential input signals and the like transmitted over a twisted pair cable or some other transmission line; if it is not above a prescribed level, outputs the detect signal as a low level; if a voltage amplitude level not below the prescribed level is detected, determines it as a high level; and notifies the detection of input signals from the transmission line.

As a circuit configuration with an enhanced drive capacity for differential output signals, for instance, a differential signal output circuit 100 shown in FIG. 25 is conceived.

Referring to FIG. 25, the source terminals of PMOS transistors Q1 and Q2 are connected in common to a node N1, which is connected to a power supply voltage VDD via a first current source C1. The drain terminals of the PMOS transistors Q1 and Q2 are connected to the drain terminals of NMOS transistors Q3 and Q4 to constitute differential output terminals OUT and OUTX. The source terminals of the NMOS transistors Q3 and Q4 are connected in common to a node N2 to be connected to a ground voltage GND via a second current source C2. The gate terminal of the PMOS transistor Q1 and the gate terminal of the NMOS transistor Q3 are connected to constitute one differential input terminal IP, and the gate terminal of the PMOS transistor Q2 and the gate terminal of the NMOS transistor Q4 are connected to constitute the other differential input terminal IM.

In the PMOS transistor Q1 and the NMOS transistor Q3 configured into an inverter, and in the PMOS transistor Q2 and the NMOS transistor Q4 configured into another inverter, the PMOS transistors Q1 and Q2 on the one hand and the NMOS transistors Q3 and Q4 on the other respectively constitute first and second differential pairs. The current from the first current source C1 on the source current side is controlled which differential pair to go through to get to the second source C2 on the sink current side, i.e., to go through the first differential pair or the second differential pair. By mutually connecting these first and second differential pairs and using the connection points as the differential output terminals OUT and OUTX, it is made possible to directly drive the differential output terminals OUT and OUTX in the responses of differential outputs OUT and OUTX to differential inputs IP and IM by supplying source/sink currents to them, and fast responsiveness is thereby achieved.

However, in the differential signal output circuit 100 of FIG. 25, the source terminals of the PMOS transistors Q1 and Q2 and of the NMOS transistors Q3 and Q4 in the inverter configuration of the first differential pair Q1 and Q2 and the second differential pair Q3 and Q4 are respectively connected to the power supply voltage VDD via the first current source C1 and to the ground voltage GND via the second current source C2. Therefore, the voltage at the node N1 to which the source terminals of the PMOS transistors Q1 and Q2 are connected is lower than the power supply voltage VDD by the operating voltage of the first current source C1, and the voltage at the node N2 to which the source terminals of the NMOS transistors Q3 and Q4 are connected is higher than the ground voltage GND by the operating voltage of the second current source C2. Supposing here that first and second current sources C1 and C2 are current mirror circuits made up of MOS transistors and the threshold voltage of the MOS transistors is 0.7 V in absolute value, the operating currents of the first and second current sources C1 and C2 can be presumed to be around 1 V, though it depends on the transistor size and amperage. If the power supply voltage VDD is 3.3 V, the voltage applied between the source terminals of the first and second differential pairs Q1/Q2 and Q3/Q4 in the inverter configuration will be only about 3.3 V−1 V−1 V=1.3 V. As the threshold voltage of the MOS transistors is 0.7 V, the intermediate voltage at the operating points of the transistors Q1/Q3 and Q2/Q4 in the inverter configuration is 0.65 V (=1.3 V/2) from each source terminal. Whereas the operating points are the centers of input signal switching, all of the transistors Q1/Q3 and Q2/Q4 in the inverter configuration are turned off at these points. Thus, in a transitional state at the time the differential input signals are switched, there is a period in which all of the transistors Q1/Q3 and Q2/Q4 in the inverter configuration are turned off and current paths are cut off.

In the differential signal output circuit 100 of FIG. 25, the first and second current sources C1 and C2 keep on flowing constant currents all the time. Therefore, when the current paths are cut off, a current flows into the node N1 connected to the first current source C1, resulting in charging of parasitic capacitance components including the capacitance components and wiring capacitances of the source terminals of the transistors Q1 and Q2 connected to the node N1, whose voltage is thereby raised. Similarly a current flows out of the node N2 connected to the second current source C2, resulting in discharging of parasitic capacitance components including the capacitance components and wiring capacitances of the source terminals of the transistors Q3 and Q4 connected to the node N2, whose voltage is thereby lowered.

Upon termination of the switching period of the differential input signal, the transistors on the side having been non-conductive before the switching are conductive to connect the current paths again. Then, the charges/discharges which were effected when the current paths were cut off are discharged/charged via these current paths from or to the differential output terminals OUT and OUTX. Thus there is the problem of voltage overshooting/ undershooting at the differential output terminals OUT and OUTX immediately after the switching.

In the differential signal output circuit 100 of FIG. 25, a differential signal output circuit wherein either pair of the first and second differential pairs Q1/Q2 and Q3/Q4 in FIG. 25 is replaced with resistance elements or the like, or in a known differential signal output circuit provided with a passive load or an active load shown in FIG. 26 for use not only in high speed transmission but also in general applications, element characteristics may differ owing to fluctuations in manufacturing between the transistors Q1 and Q2, Q3 and Q4, Q5 and Q6 or Q7 and Q8. These difference in element characteristics may give rise to differences in response characteristics, resulting in a lag in operational timing at the time of differential input signal switching between the differential pairs Q1/Q2 through Q7/Q8 to turn off both the transistors Q1/Q2 through Q7/Q8 constituting the differential pairs. As the current paths from the current sources C1, C2, C3 and C4 are cut off in this case, too, the voltages of nodes N1, N2, N3 and N4 connected to the current sources C1 through C4 vary transitionally, inviting a problem that the varied voltages propagate to the differential output terminals at the timing of the next turning-on of the other transistors of the differential pairs Q1/Q2 through Q7/Q8 and give rise to overshooting or undershooting at the differential output terminals.

Further, if there is any difference in wiring delay in the differential input signals, a lag in the timing of switching will occur between the differential pairs Q1/Q2 through Q7/Q8. In this case, too, if the delay relationship is added in such a manner as will give rise to an off period for all of the differential pairs Q1/Q2 through Q7/Q8, there will again arise a problem that, as in the above-described case, voltage overshooting or undershooting occurs at the differential output terminals.

Under the P1394b standard, on the other hand, even high speed than the 400 Mbps of the conventional IEEE 1394 standard is contemplated, and high speed transmission standards from 800 Mbps (commonly known as the S800 standard) to 3.2 Gbps (commonly known as the S3200 standard) are formulated. In order to detect the voltage amplitude level of data signals at the transmission of the S3200 standard at the maximum by bit-by-bit sampling, the signal detection circuit is required by the Nyquist sampling theorem to operate at a high sampling frequency of no less than 6.4 GHz, double the frequency of 3.2 GHz. In order to realize a signal detection circuit required to operate at such a high speed, it is usually configured of a bipolar transistor whose cutoff frequency is higher than that of a MOS transistor.

FIG. 27 illustrates an example of signal detection circuit 1000 for detecting the voltage amplitude level of data signals bit by bit. Out of the differential input signals, an input signal IN+ on the positive logic side is entered into a peak hold circuit 1100. The peak voltage level of the input signal IN+ is supplied from the peak hold circuit 1100 and entered into a voltage level detector 1200. If the input signal IN+ is above a prescribed voltage level, the transmission of an effective differential input signal is assumed, and a signal-detect signal SD is set to a high level.

The peak hold circuit 1100 here consists of an the operational amplifier A1100, a diode D1100 and a capacitor C1100. The input signal IN+ is entered into the non-inverting input terminal of the operational amplifier A1100, and the output terminal of the operational amplifier A1100 is arranged for input to the anode terminal of the diode D1100. The cathode terminal of the diode D1100 is arranged for feedback to the inverting input terminal of the operational amplifier A1100 and connected to the capacitor C1100. Incidentally, a reset switch S1100 for discharging the capacitor C1100 is connected in parallel to the capacitor C1100 and controlled with a reset signal R.

Also, the voltage level detector 1200 is arranged for inputting from the output terminal of the peak hold circuit 1100 to the non-inverting input terminal, and a preset detection level voltage VREF is entered into the inverting input terminal.

Since the peak hold circuit 1100 constitutes a voltage follower circuit into which the diode D1100 is inserted in the forward direction, the entered input signal IN+ is supplied at the output terminal of the peak hold circuit 1100, which is the cathode terminal of the diode D1100. As the diode D1100 is inserted in the forward direction into a feedback path in the voltage follower configuration, the output voltage of the peak hold circuit 1100 can follow any rise in the input signal IN+, but, against a voltage drop of the input signal IN+ conversely, the inverse direction characteristic of the diode D1100 causes the output terminal of the peak hold circuit 1100 to maintain its output voltage. The capacitor C1100 connected to the output terminal of the peak hold circuit 1100 is provided to maintain the output voltage in this process. The reset switch S1100 is provided for resetting the peak voltage set in the peak hold circuit 1100 with the reset signal R.

The voltage level detector 1200 constitutes a comparator. It compares the output voltage entered into the non-inverting input terminal from the peak hold circuit 1100 with the output voltage entered into the inverting input terminal from the detection level voltage VREF. If the output voltage from the peak hold circuit 1100 is found lower than the detection level voltage VREF, a low level is outputted as the signal-detect signal SD if it is higher, inversion takes place to output a high level thereby to notify the detection of effective differential input signals.

As stated above, in order to sample the input signal IN+ bit by bit, a maximum sampling frequency of 6.4 GHz or more, double the 3.2 GHz (S3200 standard data transfer rate, is required. Therefore, the peak hold circuit 1100 and the voltage level detector 1200 have to be configured around high speed bipolar transistors.

However, although a bipolar transistor can help realize high speed operation, high speed operation of a circuit comprising a bipolar element requires a large bias current, making it difficult to realize less power consuming operation. The P1394b standard is expected to find increasing use in personal computers and portable equipment including mobile information terminals. Portable equipment is required to permit continuous battery-powered use for many hours and, because of the needed portability, high density packaging. Therefore, both with a view to extending the duration of continuous use and in view of the packaging limitation on the permissible heat generation from the chip, a signal detection circuit conforming to P1394b is required to operate without large current consumption, and the signal detection circuit of the above-described configuration involves the problem of inability to satisfy these requirements.

Furthermore, as is typically the case with high density packaging required by portable equipment, realization of diverse functions under the P1394b standard in a high density of integration requires a system LSI configuration constituted of CMOS transistors. It is preferable also to integrate into this system LSI a signal detection circuit for detecting differential input signals from the transmission path. However, as the cut-off frequency of a MOS transistor is lower than the cut-off frequency of a bipolar transistor, it is impossible to realize with a system LSI configured of CMOS transistors the detection of the voltage amplitude level of the differential input signals by bit-by-bit sampling, which is required under the P1394b standard. Therefore, it is inevitable to use a two chip configuration in which the signal detection circuit is constituted of a bipolar LSI and other functions are constituted of a system LSI consisting of CMOS transistors, resulting in a problem that a sufficiently high density of packaging may not be achieved.

It is further conceivable to develop a novel BiCMOS LSI permitting the packaging of the bipolar transistor part to realize the signal detection circuit and the CMOS transistor part to realize other functions into a single chip. However, development of a novel LSI permitting the realization of a high speed bipolar transistor on a single chip together with a minute CMOS transistor capable of integrating large scale circuits would take enormous time and money, which means the problem of difficulty to achieve the purpose at an appropriate timing and a reasonable cost.

SUMMARY OF THE INVENTION

The present invention, attempted to resolve the above-noted problems with the prior art, is intended to provide a differential signal output apparatus which is required to operate at high speed by the demand for fast data transmission in the next generation digital interfacing, the differential signal output apparatus being capable of realizing stable high speed differential input signal switching by restraining the voltage overshooting and undershooting at differential output terminals due to timing lags of differential input signals owing to lags in response characteristics or differences in wiring delay ensuing from hardware configuration or fluctuations in manufacturing, a semiconductor integrated circuit apparatus having the differential signal output apparatus and a differential signal transmission system, and further to provide a signal detection apparatus, a signal detection method, a signal transmission system and a computer-readable program capable of realizing detection of input signals transmitted at high data transfer speed without large current consumption and at low cost.

In order to achieve the above-stated object, a differential signal output apparatus according to first aspect of the invention is provided with a differential pair for receiving differential signals; a current source, connected to one end of the differential pair, for supplying a current to the differential pair; and a capacitor connected between a branching node for branching from the current source to transistors and a low impedance node.

In the differential signal output apparatus, during a transitional period in which a current supplied from the current source connected to one end of the differential pair is switched between the transistors constituting the differential pair with the differential input signals to the differential pair, a current flows via the capacitor connected between the branching node for branching from the current source to the transistors constituting the differential pair and the low impedance node.

This prevents the voltage at the connecting node between the differential pair and the current source from varying even if any difference in response characteristics of the differential pair arising from element characteristics due to manufacturing fluctuations between the transistors constituting the differential pair and, even if there is a period during which both transistors are off as a consequence of any lag in the timing of operation at the time of differential input signal switching, because a transitional current path to the low impedance node is secured via the capacitor. Therefore, neither voltage overshooting nor voltage undershooting occurs at the differential output terminals at the timing when the completion of differential input signal switching causes the other one of the transistors constituting the differential pair to be turned on. Stable differential output signals can be obtained even when differential input signals are switched at high speed.

A differential signal output apparatus according to a second aspect of the invention is provided with a differential pair for receiving differential signals; a first current source, connected to one end of the differential pair, for supplying a current to the differential pair; and a capacitor connected between a branching node for branching from the first current source to transistors constituting the differential pair and a current supply unit.

In the differential signal output apparatus, during a transitional period in which a current supplied from the first current source connected to one end of the differential pair is switched between the transistors constituting the differential pair with the differential input signals to the differential pair, a current flows via the capacitor connected between the branching node for branching from the current source to the transistors constituting the differential pair and the current supply unit.

This makes it possible to secure a sufficient supply capacity for a transitional current if the current supply unit has a current supply capacity equal to or greater than the amperage supplied by the first current source, and to reliably restrain voltage variations at the connecting node between the differential pair and the first current source. Therefore, voltage overshooting and undershooting at differential output terminals can be restrained without fail.

A differential signal output apparatus according to a third aspect of the invention is provided with a differential pair for receiving differential signals; a current source, connected to one end of the differential pair, for supplying a current to the differential pair; and a transitional response circuit for forming a current path for letting the current supplied from the current source flow when the current to the differential pair is cut off.

In the differential signal output apparatus, during a transitional period in which the current from the current source, connected to one end of the differential pair, to the differential pair is cut off, the transitional response unit forms a current path for letting the current supplied from the current source flow.

This makes it possible to sufficiently flow the current from the current source if the current path formed by the transitional response unit has a capacity to flow a current equal to or greater than the amperage supplied by the current source, even though the current to the differential pair is cut off, and to reliably restrain voltage variations at the connecting node between the differential pair and the current source. Therefore, voltage overshooting and undershooting at differential output terminals can be restrained without fail.

A semiconductor integrated circuit apparatus according to the first aspect of the invention comprises a differential signal output circuit provided with a differential pair constituted by arranging wiring between differential input signals and between differential output signals and transistors symmetrically; a current source connected to one end of the differential pair and so arranged that connection wiring lines to the transistors be symmetrical; and a capacitor connected between a branching node for branching connection wiring from the current source to the transistors and a low impedance node and arranged in an area between the transistors.

In the semiconductor integrated circuit apparatus, wiring is done between differential input signals and between differential output signals. The transistors constituting the differential pair are arranged symmetrically, and the current source connected to one end of the differential pair is so arranged that connection wiring lines between the current source and the transistors be symmetrical. The capacitor connected between the branching node for branching connection wiring from the current source to the transistors and the low impedance node is arranged in the area between the transistors.

A semiconductor integrated circuit apparatus according to the second aspect of the invention comprises a differential signal output circuit provided with a differential pair constituted by arranging wiring between differential input signals and between differential output signals and arranging transistors symmetrically; a first current source connected to one end of the differential pair and so arranged that connection wiring lines to the transistors be symmetrical; and a capacitor connected between a branching node for branching connection wiring from the first current source to the transistors and a current supply unit having a current supply capacity equal to or greater than the amperage supplied by the first current source and arranged with the same symmetry as the symmetry of arrangement between the transistors.

In the semiconductor integrated circuit apparatus, wiring is done between differential input signals and between differential output signals. The transistors constituting the differential pair are arranged symmetrically, and the first current source connected to one end of the differential pair is so arranged that connection wiring lines between the first current source and the transistors be symmetrical. The capacitor having the same symmetry as the symmetry of arrangement between the transistors and connected between the branching node for branching connection wiring from the first current source to the transistors is arranged.

A semiconductor integrated circuit apparatus according to the third aspect of the invention comprises a differential signal output circuit provided with a first differential pair constituted by arranging wiring between differential input signals and between differential output signals and arranging transistors of a first conductivity type symmetrically; a first current source connected to one end of the first differential pair and so arranged that connection wiring lines to the transistors of the first conductivity type be symmetrical; a second differential pair arranged opposite the first differential pair, constituted by arranging wiring between differential input signals and between differential output signals and transistors of a second conductivity type symmetrically; a second current source connected to one end of the second differential pair and so arranged that connection wiring lines to the transistors of the second conductivity type be symmetrical; and a capacitor connected between a first branching node for branching connection wiring from the first current source to the transistors of the first conductivity type and a second branching node for branching connection wiring from the second current source to the transistors of the second conductivity type and arranged in an area surrounded by the first differential pair and the second differential pair.

In the semiconductor integrated circuit apparatus, wiring is done between differential input signals and between differential output signals. The transistors constituting the first and second differential pairs and the first and second current sources are arranged symmetrically. The transistors constituting the first and second differential pairs are arranged opposite each other. The first and second current sources respectively connected to one end each of the first and second differential pairs are so arranged that the connection wiring lines to the transistors be symmetrical. The capacitor is arranged in the area surrounded by the first and second differential pairs.

The semiconductor integrated circuit apparatuses according to the first through third aspects of the invention can minimize dispersion of characteristics among and balance the wiring loads between the differential input signals and the differential output signals by symmetrically arranging the constituent elements of the differential signal output apparatus, resulting minimization of differences in propagation delay of the differential signals.

As the symmetry of the capacitor relative to the constituent elements and wiring lines can be enhanced at the same time, the semiconductor integrated circuit apparatus according to the first aspect can minimize any imbalance of voltage variations at the node connecting the differential pair and the current source at the time of differential input signal switching.

The semiconductor integrated circuit apparatus according to the second aspect can minimize any imbalance of voltage variations at the node connecting the differential pair and the first current source.

The semiconductor integrated circuit apparatus according to the third aspect can minimize any imbalance of voltage variations at the node connecting the first and second differential pairs and the first and second current sources, respectively.

Therefore, they can effectively restrain voltage overshooting and voltage undershooting at the differential output terminals. Furthermore, where there is a so-called temperature gradient, i.e. where the chip temperature varies with the position on the semiconductor integrated circuit apparatus from the heat source, the constituent elements can be cause to operate with similar temperature characteristics if there is a symmetric layout pattern with respect to the heat source. There further is the advantage that wiring loads can be well balance if the types and routes of wiring lines between the differential input signals and the differential output signals are uniformized.

A differential signal transmission system according to the first aspect of the invention comprises a differential signal output circuit provided with a differential input unit into which differential signals are entered; a current supply unit for supplying a current to the differential input unit; and a capacitor connected between a connection node between the differential input unit and the current supply unit and a low impedance node.

A differential signal transmission system according to the second aspect of the invention comprises a differential signal output circuit provided with a differential input unit into which differential signals are entered; a first current supply unit for supplying a current to the differential input unit; and a capacitor connected between a connection node between the differential input unit and the first current supply unit and a second current supply unit having a current supply capacity equal to or greater than the amperage supplied by the first current supply unit.

A differential signal transmission system according to the third aspect of the invention comprises a differential signal output circuit provided with a first differential input unit configured in a first conductivity type transistor for receiving differential signals; a first current supply unit for supplying a current to the first differential input unit; a second differential input unit configured in a second conductivity type transistor, of which differential output terminals are connected to the differential output terminals of the first differential input unit and the differential signals received; a second current input unit for supplying a current to the second differential input unit; and a capacitor connected between a connection node between the first differential input unit and the first current input unit and another connection node between the second differential input unit and the second current input unit.

The differential signal transmission systems according to the first through third aspect of the present invention can obtain stable differential output signals even during high speed differential input signal switching keeping free of voltage overshooting and voltage undershooting the differential output signals responding to the differential input signals.

To achieve the aforementioned object, a signal detection apparatus according to the first aspect of the invention is configured of a level detection unit for detecting the voltage amplitude level of input signals; a state transition detection unit for detecting any state transition in the output signals of the level detection unit; a signal confirmation unit for issuing a notification signal when the state transition detection unit has detected state transitions a prescribed number of times during a first prescribed length of time; a non-signal confirmation unit for issuing a notification signal when the state transition detection unit has detected no state transition during a second prescribed length of time; and a detect signal generation unit for generating a detect signal that is validated by the signal confirmation unit and invalidated by the non-signal confirmation unit. The "non-signal" in this context means a state in which no input signal is detected.

A signal detection method according to the first aspect of the invention comprises a level detection step of detecting the voltage amplitude level of input signals; a state transition detection step of detecting any state transition in the input signals detected at the level detection step; a signal confirmation step of notifying the detection of state transitions a prescribed number of times during a first prescribed length of time at the state transition detection step; a non-signal confirmation step of notifying the detection of no state transition during a second prescribed length of time at the state transition detection step; and a detect signal generation step of generating a detect signal that is validated at the signal confirmation step and invalidated at the non-signal confirmation step.

In the signal detection apparatus and the signal detection method, if any state transition is detected on the basis of the voltage amplitude level of detected input signals, a notification signal of signal confirmation is issued when state transitions have been detected a prescribed number of times during the first prescribed length of time, or if no state transition is detected during the second prescribed length of time, a notification signal of non-signal confirmation is issued. A detect signal that is validated by the notification signal of signal confirmation and invalidated by the notification signal of non-signal confirmation is issued.

In this way, the circuitry for the detection of signal state transition, confirmation of signals, confirmation of non-signals and generation of detect signals can be configured of logic circuits except the part for comparing the voltage amplitude level of input signals with a prescribed voltage level, and accordingly the circuit operation can be realized with reduced current consumption if a digital integrated circuit, such as a CMOS-LSI, is used. Thus, less power consuming operation can be achieved with a system using either the signal detection apparatus or the signal detection method according to the invention. Where this system is used in a battery-powered system such as portable equipment, it will prove suitable for continuous use for many hours, help solve the problem of heat generating in IC packaging, and thereby make possible high density mounting.

The first and second prescribed lengths of time for signal confirmation and non-signal confirmation can be appropriately set in accordance with the detection period standard allocated for signal detection, and it is not absolutely necessary to accomplish signal detection in a length of time matching the high signal transfer speed. Therefore, the first and second prescribed lengths of time can be set longer than the length of time matching the high signal transfer speed, and a system using either the signal detection apparatus or the signal detection method can realize operation with reduced current consumption. This system is suitable for use as a battery-powered system such as portable equipment.

Where any state transition of input signals occurs within a prescribed period according to a standard of signal transmission, the maximum time span in which state transitions are repeated is determined, and accordingly the maximum time span in which state transitions are detected a prescribed number of times in signal detection is determined. Therefore, system using either the signal detection apparatus or the signal detection method according to the invention, it is possible to accurately judge whether an input is a valid signal or noise according to whether or not signals are detected a prescribed number of times during the maximum time span. Signal detection can be accomplished with a simple circuit configuration with reduced current consumption without requiring a circuit for carrying out signal detection by sampling in a short period matching the high signal transfer speed.

A signal transmission system according to the first aspect of the invention comprises a serial bus; a level detection unit, connected on the serial bus, for detecting the voltage amplitude level of input signals from the serial bus; a state transition detection unit for detecting any state transition in the output signals of the level detection unit; a signal confirmation unit for issuing a notification signal when the state transition detection unit has detected state transitions a prescribed number of times during a first prescribed length of time; a non-signal confirmation unit for issuing a notification signal when the state transition detection unit has detected no state transition during a second prescribed length of time; and a detect signal generation unit for generating a detect signal that is validated by the signal confirmation unit and invalidated by the non-signal confirmation unit.

In the signal transmission system, a signal detection apparatus detects the voltage amplitude level of input signals from the serial bus and transmits signals over the serial bus.

Since this configuration enables the signal detection apparatus to be constituted of a digital IC, such a CMOS-LSI, circuit operation can be realized with reduced current consumption. The first and second prescribed lengths of time for signal confirmation and non-signal confirmation can be appropriately set in accordance with the detection period standard allocated for signal detection on the serial bus, and it is not absolutely necessary to accomplish signal detection in a length of time matching the high signal transfer speed. The first and second prescribed lengths of time can be set longer than the length of time matching the high signal transfer speed, and a serial bus using the signal detection apparatus can realize operation with reduced current consumption. Where any state transition of input signals occurs within a prescribed period according to a standard of signal transmission on a serial bus, the maximum time span in which state transitions are repeated is determined, and accordingly the maximum time span in which state transitions are detected a prescribed number of times in signal detection is determined. It is possible to accurately judge whether an input is a valid signal or noise according to whether or not signals are detected a prescribed number of times during the maximum time span. A signal transmission system capable of reliable signal detection can be realized with reduced current consumption.

A computer-readable program according to the first aspect of the invention executes signal transmission on a serial bus by a signal detection method comprising a level detection step of detecting the voltage amplitude level of input signals; a state transition detection step of detecting any state transition in the input signals detected at the level detection step; a signal confirmation step of notifying the detection of state transitions a prescribed number of times during a first prescribed length of time at the state transition detection step; a non-signal confirmation step of notifying the detection of no state transition during a second prescribed length of time at the state transition detection step; and a detect signal generation step of generating a detect signal that is validated at the signal confirmation step and invalidated at the non-signal confirmation step.

In the computer-readable program, if any state transition is detected on the basis of the voltage amplitude level of detected input signals, a notification signal of signal confirmation is issued when state transitions have been detected a prescribed number of times during the first prescribed length of time, or if no state transition is detected during the second prescribed length of time, a notification signal of non-signal confirmation is issued. A detect signal that is validated by the notification signal of signal confirmation and invalidated by the notification signal of non-signal confirmation is issued.

In this configuration, as a step for executing the signal detection method when signal transmission is to be accomplished on the serial bus is stored in the computer-readable program, the sequence of steps can be easily executed by executing this program.

Furthermore, because the sequence of steps can be stored in the computer-readable program, it can be recorded on various recording media or flexibly distributed and installed via a telecommunication line such as the Internet.

The above and further objects and novel features of the invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings,

FIG. 6 is a pattern diagram illustrating the layout of the differential signal output circuit in the first embodiment.

FIG. 8 is a circuit block diagram illustrating a signal detection apparatus in a third embodiment.

FIG. 10 is a code table (1) listing 8b10b codes according to the P1394b standard.

FIG. 11 is a code table (2) listing 8b10b codes according to the P1394b standard.

FIG. 15 is a state transition diagram illustrating the signal-detect signal setting sequence.

FIG. 16 is a state transition diagram illustrating the signal-detect signal resetting sequence.

FIG. 17 is a time chart showing the signal-detect signal setting sequence.

FIG. 18 is a time chart showing actions during signal-detect signal setting.

FIG. 19 is a time chart showing the signal-detect signal resetting sequence.

FIG. 20 is a configurational diagram of a signal detection apparatus in a fourth embodiment.

FIG. 21 is a flow chart showing the signal-detect signal setting flow in the signal detection method executed by the signal detection apparatus in the fourth embodiment.

FIG. 22 is a flow chart showing the signal-detect signal resetting flow in the signal detection method executed by the signal detection apparatus in the fourth embodiment.

FIG. 24 is a system configuration diagram illustrating an example of signal transmission system configuration.

FIG. 25 is a circuit diagram illustrating a differential signal output circuit according to the prior art.

DETAILED DESCRIPTION

Figure 23:
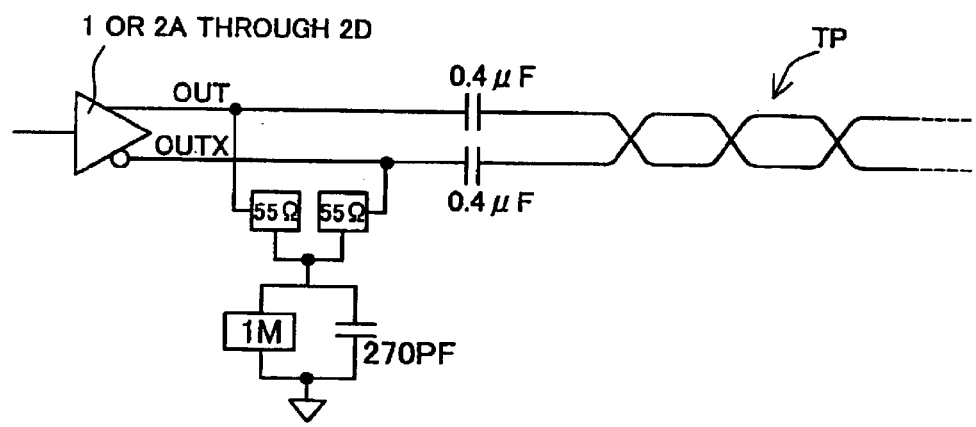
FIG. 23 is a block diagram illustrating an example of differential signal transmission system.

First and second embodiments in which a differential signal output apparatus and a semiconductor integrated circuit apparatus having the differential signal output apparatus according to the present invention will be described in detail below with reference to FIG. 1 through FIG. 7. Also, third and fourth embodiments in which a signal detection apparatus, a signal detection method and a computer-readable program according to the invention will be described in detail below with reference to FIG. 8 through FIG. 22. Further an example of differential signal transmission system according to the invention will be described in detail with reference to FIG. 23, and so will be an example of signal transmission system configuration according to the invention with reference to FIG. 24.

Figure 1:
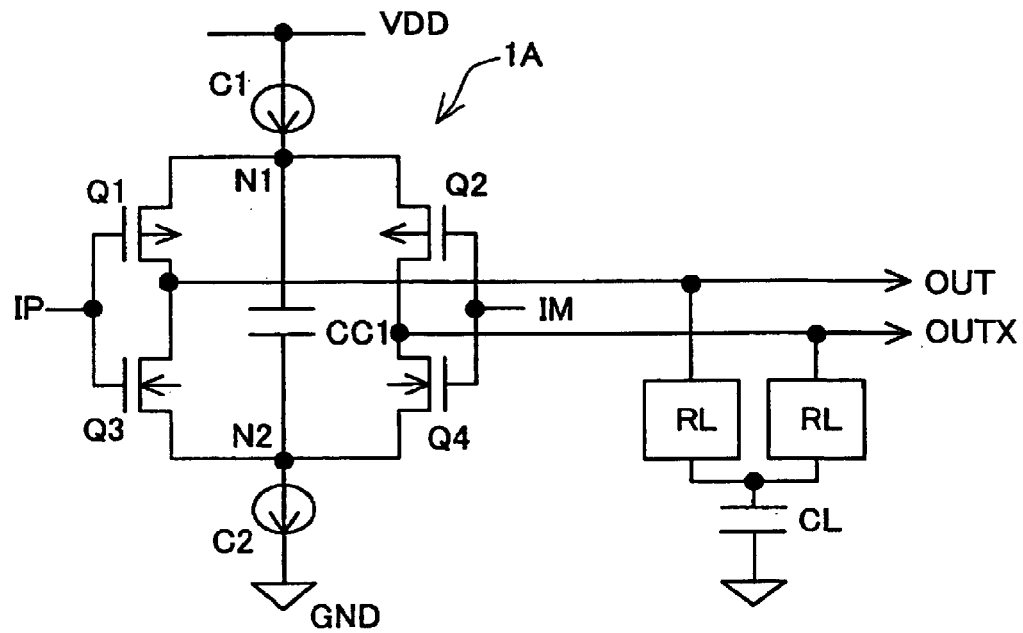
FIG. 1 is a circuit diagram illustrating a differential signal output circuit in a first embodiment.
Figure 2:
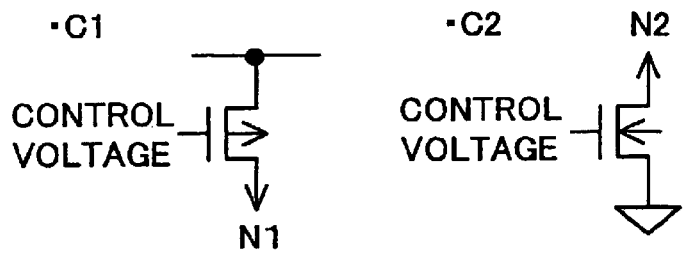
FIG. 2 is a circuit diagram illustrating an example of current source in the first embodiment.
Figure 3:
FIG. 3 is a circuit diagram illustrating a specific example of a capacitor in the first embodiment.

In a differential signal output circuit 1A in the first embodiment shown in FIG. 1, a capacitor CC1 is further provided between the nodes N1 and N2 in addition to the differential signal output circuit 100 according to the prior art shown in FIG. 25. In FIG. 1, loads to be connected to the differential output terminals OUT and OUTX in the differential signal transmission system are also represented. Thus, resistance loads RL connected to the differential output terminals OUT and OUTX and a capacitance load CL connected between the resistance load RL and the ground voltage GND constitute a load circuit. Further, as shown in FIG. 2, as circuitry examples of the first current source C1 and the second current source C2, a PMOS transistor and an NMOS transistor to each of whose gate terminals a control voltage is inputted can be used. Also, as shown in FIG. 3, as a circuitry example of capacitor CC1, the gate capacitance of the NMOS transistor can be utilized.

Out of the differential input signals to the differential input terminals IP and IM, if the voltage level of the signal to the differential input terminal IP is higher than that to the differential input terminal IM, a transistor Q1 out of the PMOS transistors Q1 and Q2 constituting the first differential pair will be turned off, and the transistor Q2, turned on. Out of the NMOS transistors Q3 and Q4 constituting the second differential pair, the transistor Q3 will be turned on, and the transistor Q4, turned off. Therefore, the regular current path these two differential pairs constitute raises the voltage level at the differential output terminal OUTX from the first current source C1 via the PMOS transistor Q2. Further, the current supplied to the differential output terminal OUTX from the first current source C1 flows to the ground voltage GND via the two resistance loads RL from the differential output terminal OUT and via the NMOS transistor Q3 from the second current source C2. As the differential output terminal OUT undergoes current subtraction, and takes on a lower voltage level than that of the differential output terminal OUTX to which a current is supplied. As a result, differential output signals which raises the differential output terminal OUTX to a high level is supplied to the differential output terminals OUT and OUTX. If the voltage level of the signal to the differential input terminal IP is lower than the voltage level of the signal to the differential input terminal IM, a similar action can be caused to take place by reversing the voltage relationship, and differential output signals to raise the differential output terminal OUT to a high level is outputted. What has been described so far is the operation of the differential signal output circuit 1A in a regular state in which the relationship as to the signal voltage level is not reversed between the differential input terminals IP and IM.

Next will be described a case in which the relationship as to the signal voltage level is reversed between the differential input terminals IP and IM. In the circuit configuration illustrated in FIG. 1, all of the MOS transistors Q1/Q2 and Q3/Q4 constituting the first and second differential pairs may go off during the switching period of signals to the differential input terminals IP and IM depending on some conditions including the power supply voltage VDD, the threshold voltages of the MOS transistors Q1 through Q4, voltage drops at the first and second current sources C1 and C2 and the voltage levels of differential input signals. Also, differences in element characteristics of the constituting transistors Q1 through Q4 due to fluctuations in manufacturing or differences in propagation delay of propagating signals ensuing from parasitic resistances, parasitic capacitances and so forth on the signal wiring or the like of the differential input terminals IP and IM may give rise to lags in response characteristics at the time of switching, with the result that at least one of the PMOS transistors Q1 and Q2 of the first differential pair or of the transistors Q3 and Q4 constituting the second differential pair goes off.

If this happens, the regular current path will be cut off. However, as the first and second current sources C1 and C2 continue to flow constant currents all the time, the currents keep on flowing to the nodes N1 and N2 to which the first and second current sources C1 and C2 are connected even though the regular current path is cut off. If there were no capacitor CC1, the current from the first current source C1 would flow to the node N1 and, by charging a capacitance component connected to the node N1, transitionally raises the voltage at the node N1. Also, the current to the second current source C2 will flow out of the node N2 and, by discharging a capacitance component connected to the node N2, transitionally brings down the voltage at the node N2.

As the capacitor CC1 is connected between the node N1 and N2 in the differential signal output circuit 1A in the first embodiment, a transitional current can be flowed via the capacitor CC1 when the current path is transitionally cut off at the time the signals to the differential input terminals IP and IM are switched. This transitional current flows only during the transitional switching period of the differential input signals applied to the differential input terminals IP and IM, and it is an alternating current having a frequency component. The capacitor CC1, because of its element characteristics, has an impedance in inverse proportion to the frequency of the transitional current that flows in. Therefore, by appropriately regulating the impedance of the capacitor CC1 according to the frequency component of the transitional current, i.e. the duration of the cut-off state of the current path at the time of switching, the impedance of the capacitor CC1 can be set low relative to the transitional current having a specific frequency component so that the capacitor CC1 can sufficiently flow the transitional current. Since the amperages of the first current source C1 and the second current source C2 are set equal here because of the symmetry of the circuit actions of the differential signal output circuit 1A, the transitional current flowing from the first current source C1 to the second current source C2 via the capacitor is well balanced, and neither charges nor discharges the capacitance components connected to the nodes N1 and N2, so that no transitional voltage variations occur at the nodes N1 and N2. Therefore, voltage overshooting and undershooting at the differential output terminals OUT and OUTX which would result from such voltage variations can be restrained.

The impedance of the capacitor CC1 can be calculated by the following equation, with the transitional cut-off duration of the current path during differential input signal switching being supposed to be period of the transitional current pulse flowing to the capacitor CC1:

$$Xc=1/(2\pi fC)$$

where f is the frequency component, and C, the capacitance of the capacitor CC1. By setting this impedance Xc sufficiently small relative to the resistance loads RL×2 of the differential signal output circuit 1A (Xc<<RL×2), voltage variations emerging at the nodes N1 and N2 can be restrained to an almost negligible level. Since voltage variations emerging at the nodes N1 and N2 during the transitional cut-off of the current path, after they shift as they are to the differential output terminals OUT and OUTX, are connected by the resistance loads RL×2 to determine the peak voltages of voltage overshooting/ undershooting according to the prior art, connection of the nodes N1 and N2 by the capacitor CC1 having a sufficiently small impedance Xc relative to the resistance loads RL×2 almost eliminates voltage variations at the nodes N1 and N2, i.e. voltage overshooting/undershooting at the differential output terminals. Incidentally, the duration of the current path can be easily computed by circuit simulation or otherwise.

Figure 4:
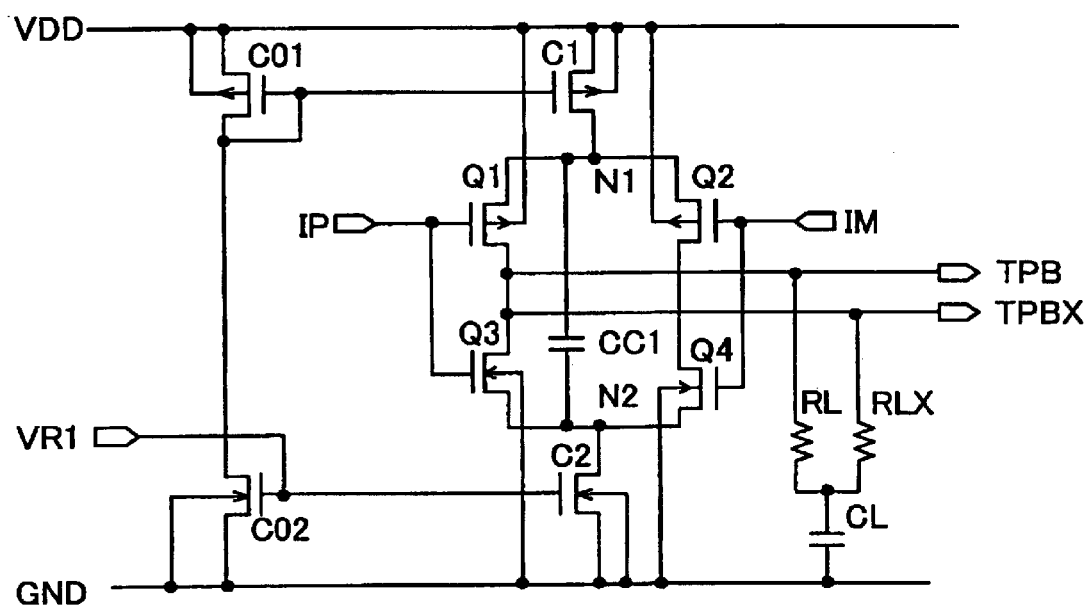
FIG. 4 is a circuit diagram illustrating a specific example of in the first embodiment.

FIG. 4 illustrates a specific example of the first embodiment. The basic circuit connection is the same as that in the differential signal output circuit 1A in the first embodiment shown in FIG. 1. The first current source C1 constitutes a first current mirror circuit with the PMOS transistor C01. Similarly, the second current source C2 constitutes a second current mirror circuit with the NMOS transistor C02. The first current mirror circuit and the second current mirror circuit are so configured that the same amperages are caused to flow therein by the connection of the PMOS transistor C01 and the NMOS transistor C02, and the first and second current sources C1 and C2 supply the same amperages. The gate terminal VR1 of the second current mirror circuit is made adjustable to make the amperage variable. The MOS transistor C01, C1, C02 and C2 constituting the first and second current sources and the back gate terminals of the MOS transistor Q1 through Q4 constituting first and second differential pairs are connected to the power supply voltage VDD (where PMOS transistors are used) and to the ground voltage GND (where NMOS transistors are used). The capacitor CC1 is connected between the nodes N1 and N2. The resistance loads RL and RLX are connected to the differential output terminals TPB and TPBX, respectively; the other ends of the resistance loads RL and RLX are connected in common to the capacitance load CL; and the other end of the capacitance load CL is connected to the ground voltage GND. The parameters of the constituent elements are listed in Table 1.

TABLE 1

| MOS | Type | Channel length (L) | Channel width (W) | m (number of elements) |
|---|---|---|---|---|
| C01 | PMOS | 1.0 μm | 43.0 μm | 2 |
| C1 | PMOS | 1.0 μm | 43.0 μm | 20 |
| C02 | NMOS | 1.0 μm | 18.0 μm | 2 |
| C2 | NMOS | 1.0 μm | 18.0 μm | 20 |
| Q1 | PMOS | 0.34 μm | 44.0 μm | 2 |
| Q2 | PMOS | 0.34 μm | 44.0 μm | 2 |
| Q3 | NMOS | 0.34 μm | 20.0 μm | 2 |
| Q4 | NMOS | 0.34 μm | 20.0 μm | 2 |

| Capacitor | Capacitance |
|---|---|
| CC1 | 10 pF |

| Load | Type | Value |
|---|---|---|
| RL | Resistance load | 55 Ω |
| RLX | Resistance load | 55 Ω |
| CL | Capacitance load | 250 pF |

Figure 5A:
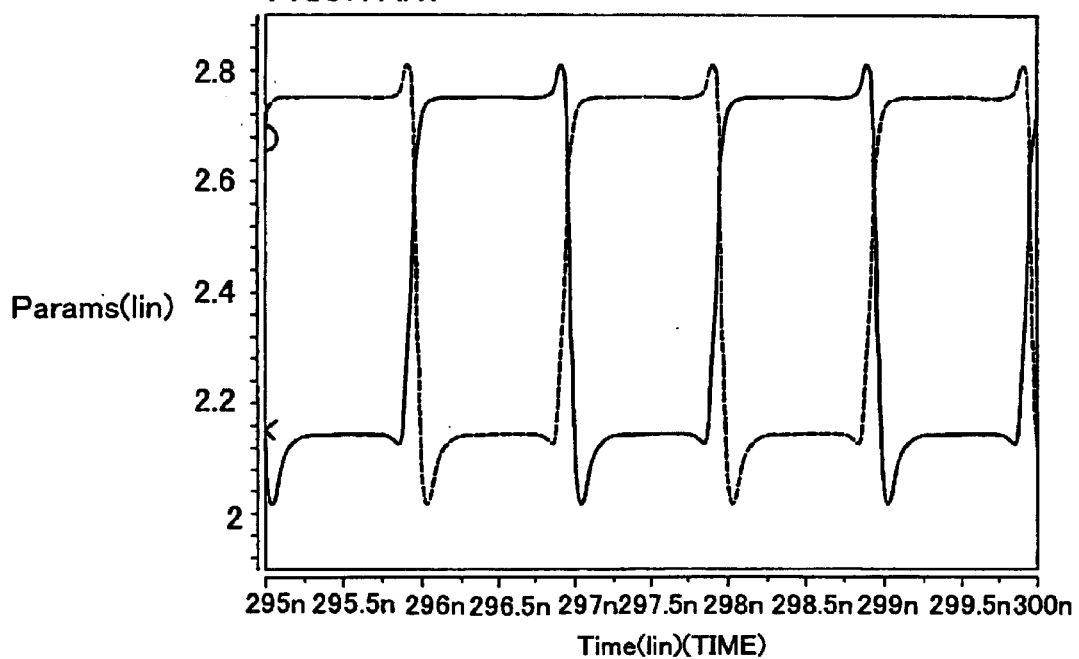
FIG. 5 is a waveform diagram illustrating differential output waveforms according to the result of simulation of the specific example of the first embodiment.
Figure 5B:
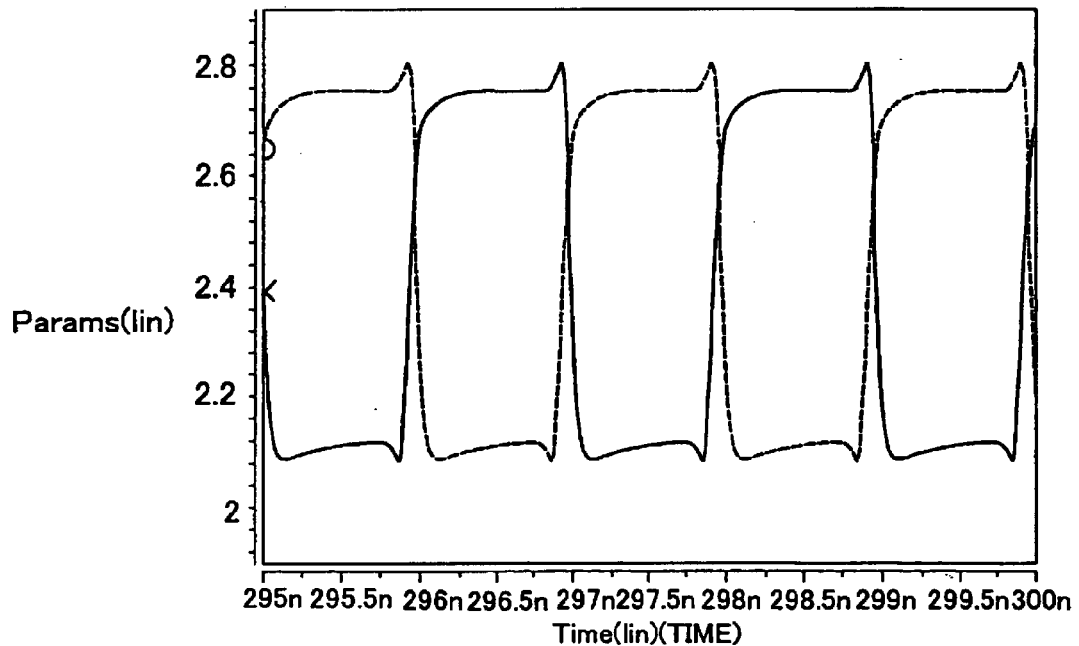

FIG. 5B shows the result of transition analysis with a spice simulator using a Bsim3 model, with the power supply voltage VDD being supposed to be 3.3 V and the differential input signal to be a trapezoidal wave without skewing of 500 MHz in the circuit of FIG. 4 having the parameters of Table 1. The waveforms are those of the differential output signals supplied from the differential output terminals TPB and TPBX. For supplementary information, the waveforms of differential output signals resulting from the simulation of the differential signal output circuit 100, deprived of the capacitor CC1 in FIG. 4, are shown in FIG. 5A.

It is seen from the waveforms of FIG. 5A that, at the time of differential output signal switching, voltage overshooting by about 60 mV occurs in a transition from the low to the high level and a voltage undershooting by about 120 mV, in a transition from the high to the low level. It is also seen that the voltage pulse period of voltage overshooting/ undershooting is about 250 psec and the frequency is about 4 GHz. By contrast, it is seen from FIG. 5B that, in the differential signal output circuit 1A in the first embodiment with the capacitor CC1 for the transitional current path added thereto, the voltage overshooting is restrained to 40 mV or less and the voltage undershooting, to −30 mV or less. The capacitance of the capacitor CC1 here is 10 pF, and the impedance of the capacitor CC1 at a frequency of 4 GHz is:

$$Xc(4\text{ GHz})=1/(2\pi \times 4\text{ GHz} \times 10\text{ pF}) \cdot 4\Omega$$

It is seen that, as the resistance load RL of each of the differential output terminals TPB and TPBX is 55Ω, the impedance of the capacitor CC1 is sufficient relative to RL×2=112Ω. For this reason, the voltage overshooting/ undershooting which would arise with the resistance load of 112 Ω according to the prior art can be sufficiently reduced with the 4 Ω impedance of the capacitor CC1 in the first embodiment.

Where the differential signal output circuit 1A in the first embodiment is to be laid out as a semiconductor integrated circuit apparatus as shown in FIG. 6, it is preferable to symmetrically arrange the MOS transistors Q1 through Q4 constituting the first and second differential pairs. Further it is preferable to symmetrically arrange the first and second current sources C1 and C2 as well. It is also preferable to symmetrically arrange the capacitor CC1 in an area surrounded by the MOS transistors Q1 through Q4 constituting the first and second differential pairs. It is preferable here to configure the capacitor CC1 both of MOS capacitors CM1 and CM2 using the gate capacitance of a MOS transistor which can secure a large capacitance relative to the area it occupies and a parallel planar type capacitor CP which permits accurate capacitance setting through the area efficiency of the capacitance is not so high. This makes possible accurate configuration of a capacitor CC1 in the minimized area by first setting roughly a capacitance with the MOS capacitors CM1 and CM2 and finely adjusting the capacitance with the parallel planar capacitor CP. It is preferable to have the arrangement reflect consideration for symmetry by, for instance disposing a parallel planar capacitor CP between the MOS capacitors CM1 and CM2 with a view to greater accuracy. The expression "parallel planar" in the parallel planar capacitor CP here refers to a configuration by appropriate combination of constituent elements of a semiconductor integrated circuit apparatus, such as a combination of a diffusion layer and a metal layer or a combination of metal layers alone. Although the parallel planar capacitor CP is arranged with the MOS capacitors CM1 and CM2 on its two sides in the pattern illustrated in FIG. 6, obviously the relationship between the two kinds of constituent elements can be reversed, i.e. with an MOS capacitor arranged in the center, to achieve the same effect only if the relationship can maintain the symmetry of arrangement.

Symmetric arrangement here can set off unevenness of conditions among different constituent elements in the manufacturing process due to differences in diffusion concentration and in sheet resistance of wiring layers ensuing from the disturbance of ion implantation quantity and differences in thickness of inter-layer insulating films resulting from micro-heterogeneity of chemical reactions, so that differences in characteristics among elements due to fluctuations in manufacturing can be minimized. Furthermore, if there is any heat generation accompanying the circuit actions of the semiconductor integrated circuit apparatus, there may arise a so-called temperature gradient, i.e. differences in temperature with the position on the chip relative to the heat source on the semiconductor integrated circuit apparatus. In such a case, if the layout pattern is symmetric with respect to the heat source, it is possible to let the different constituent elements operate with similar temperature characteristics. In the case of FIG. 6, if the heat source is above or below the surface of the drawing, the temperature characteristics of the different constituent elements can be equalized.

As hitherto described in detail, in the differential signal output circuit 1A in the first embodiment and the semiconductor integrated circuit apparatus having this differential signal output circuit 1A, even if the transistors Q1 through Q4 constituting the first and second differential pairs go off during differential input signal switching for some reason in circuit configuration or if fluctuations in manufacturing give rise to differences in element characteristics among the transistors Q1 through Q4 constituting the first or second differential pair, resulting in a period during which the transistors Q1 and Q2 or Q3 and Q4 of the first or second differential pair are off owing to a lag in operation timing due to an imbalance in the response characteristics of the first or second differential pair at the time of switching, a current path is secured between the first current source C1 and the second current source C2 via the capacitor CC1, there is no possibility of variation in the voltages of the connecting nodes N1 and N2 between the first and second differential pairs and the first and second current sources C1 and C2, respectively. Therefore, at the timing for each of the other constituent transistors of the first and second differential pairs to come on with the completion of differential input signal switching, in this specific example of the differential output terminals OUT and OUTX (TPB and TPBX in the specific example of the first embodiment), neither voltage overshooting nor voltage undershooting arises. Stable differential output signals can be obtained even if the differential input signals are switched at high speed.

As the impedance Xc of the capacitor CC1 to flow a transitional current at the time of transitional response here is smaller than the load impedance RL×2, voltage variations at the nodes N1 and N2 can be effectively restrained.

By symmetrically arranging the elements constituting the differential signal output circuit 1A, unevenness of characteristics among the constituent elements can be kept to the minimum, and equaling the lengths of wiring between the differential input signals and between the differential output signals makes it possible to minimize differences in propagation delay among the differential signals. At the same time, the symmetry of capacitor CC1 arrangement with respect to the constituent elements and wiring enables the capacitor CC1 to minimize the imbalance in voltage variation between the connecting nodes N1 and N2 for the first and second differential pairs and the first and second current sources C1 and C2 at the time of differential input signal switching. Therefore, voltage overshooting and voltage undershooting at the differential output terminals OUT and OUTX can be effectively restrained. Furthermore, where there is a so-called temperature gradient, i.e. differences in temperature with the position on the chip relative to the heat source on the semiconductor integrated circuit apparatus, if the layout pattern is symmetric with respect to the heat source, it is possible to let the different constituent elements operate with similar temperature characteristics.

Figure 26A:
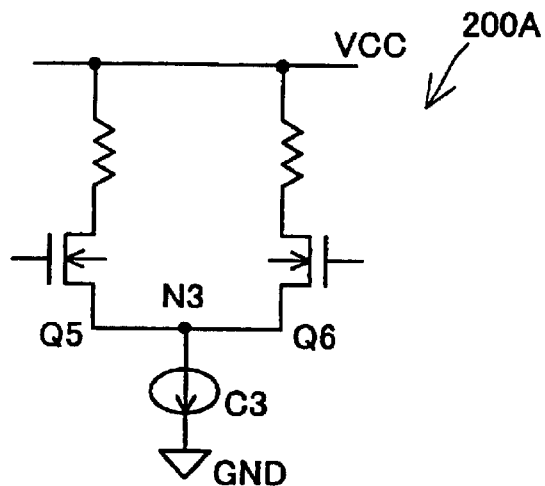
FIG. 26 is a circuit diagram illustrating another differential signal output circuit according to the prior art.
Figure 26B:
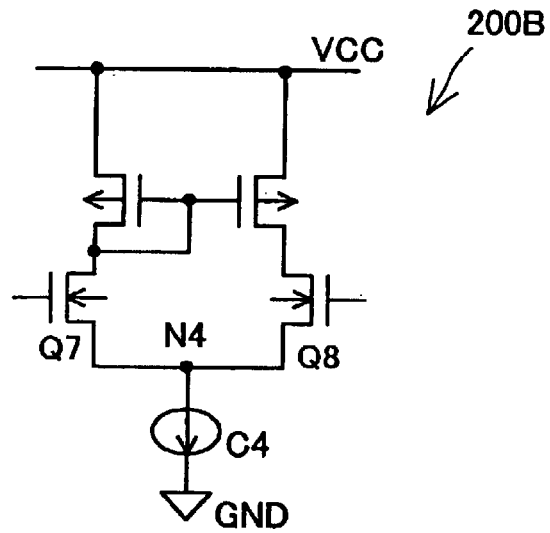

In the configurations of differential signal output circuits 2A, 2B, 2C and 2D in the second embodiment shown in FIG. 7, in addition to the differential signal output circuits 200A and 200B according to the prior art shown in FIG. 26, capacitors CC2$n$ and CC3$n$ are connected between connection nodes N3$n$ and N4$n$, which connect the differential pair and the current source, and the power supply voltage VDD, or capacitors CC2$p$ and CC3$p$ are connected between connection nodes N3$p$ and N4$p$ and the ground voltage GND. Also, as in the first embodiment, current sources C3$n$ and C4$n$ can be configured of NMOS transistors shown in FIG. 2, and current sources C3$p$ and C4$p$, of PMOS transistors shown in FIG. 2. Further, capacitors CC2$n$ and CC3$n$ can be configured of NMOS transistors shown in FIG. 3, and capacitors CC2$p$ and CC3$p$, of PMOS transistors whose polarity is inversed to the NMOS transistors shown in FIG. 3.

Figure 7A:
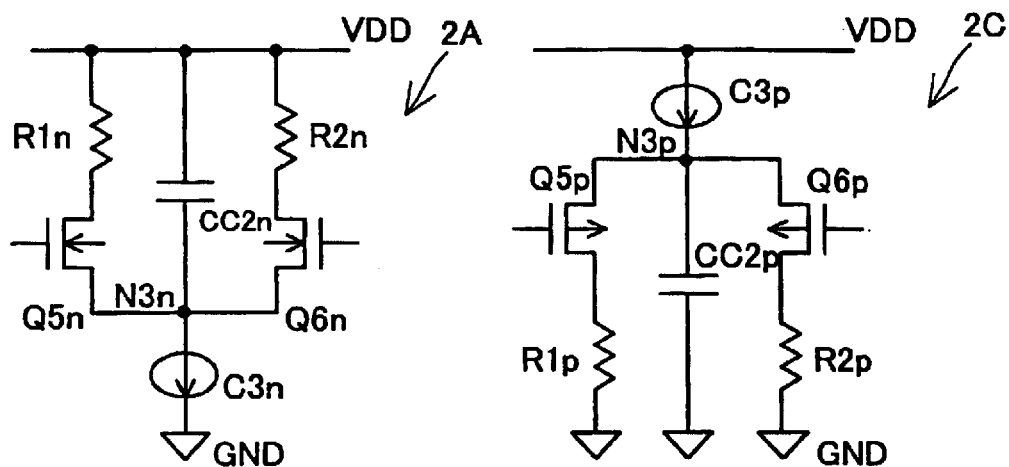
FIG. 7 is a circuit diagram illustrating a differential signal output circuit in a second embodiment.
Figure 7B:
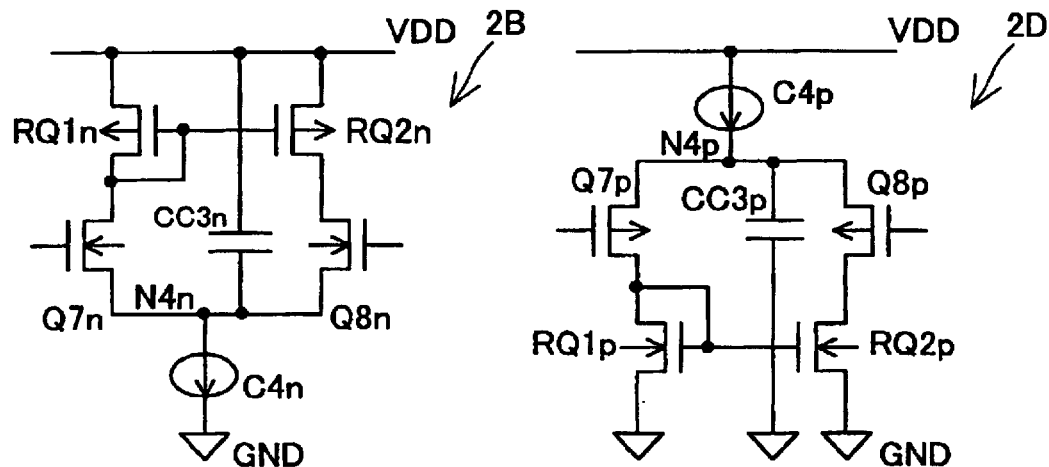

In the second embodiment, the configuration is such that one of the capacitors CC2$n$, CC3$n$, CC2$p$ and CC3$p$, to which transitional currents are flowed, is connected to a low impedance node such as the power supply voltage VDD or the ground voltage GND. FIG. 7A shows a case in which passive loads are used for configuring the differential signal output circuits 2A and 2C, while FIG. 7B shows a case in which positive loads are used for configuring the differential signal output circuits 2B and 2D. In either case, the same effect can be achieved. As their specific actions are the same as in the first embodiment, the description is dispensed with here.

In the second embodiment as well, it is preferable for the constituent elements to be laid out symmetrically on the semiconductor integrated circuit apparatus.

As described above, in the differential signal output circuits 2A through 2D in the second embodiment and the semiconductor integrated circuit apparatus having such differential signal output circuit 2A through 2D, even if fluctuations in manufacturing give rise to differences in element characteristics among the transistors Q5n/Q6n, Q7n/Q8n, Q5p/Q6p and Q7p/Q8p constituting the differential pairs, resulting in a period during which the transistors Q5n/Q6n, Q7n/Q8n, Q5p/Q6p and Q7p/Q8p are off owing to a lag in operation timing due to an imbalance in the response characteristics of the differential pairs at the time of switching, a current path is secured to the power supply voltage VDD, which is a low impedance node, or to the grounding voltage GND via the capacitors CC2n, CC3n, CC2p and CC3p, there is no possibility of variation in the voltages of the connecting nodes N3n, N4n, N3p and N4p between the differential pairs and the current sources C3n, C4n, C3p and C4p, respectively. Therefore, at the timing for each of the other constituent transistors of the differential pairs to come on with the completion of differential input signal switching, neither voltage overshooting nor voltage undershooting arises. Stable differential output signals can be obtained even if the differential input signals are switched at high speed.

As a transitional current flows to the power supply voltage VDD or to the ground voltage GND, which is a low impedance node, a sufficient supply capacity of the transitional current can be secured, and voltage variations at the connection nodes N3n, N4n, N3p and N4p between differential pairs and current sources can be prevented reliably. Therefore, voltage overshooting and voltage undershooting at the differential output terminals can be prevented without fail.

Symmetric arrangement of the elements constituting the differential signal output circuits 2A through 2D can minimize unevenness of characteristics among the constituent elements, and equaling the lengths of wiring between the differential input signals and between the differential output signals makes it possible to minimize differences in propagation delay among the differential signals. Furthermore, symmetric arrangement of the constituent elements can also be effective against a temperature gradient. Therefore, imbalance in voltage variations at the connection node N3n, N4n, N3p and N4p at the time of differential input signal switching can be kept to the minimum. Accordingly, voltage overshooting and voltage undershooting at the differential output terminals can be effectively restrained.

Figure 27:
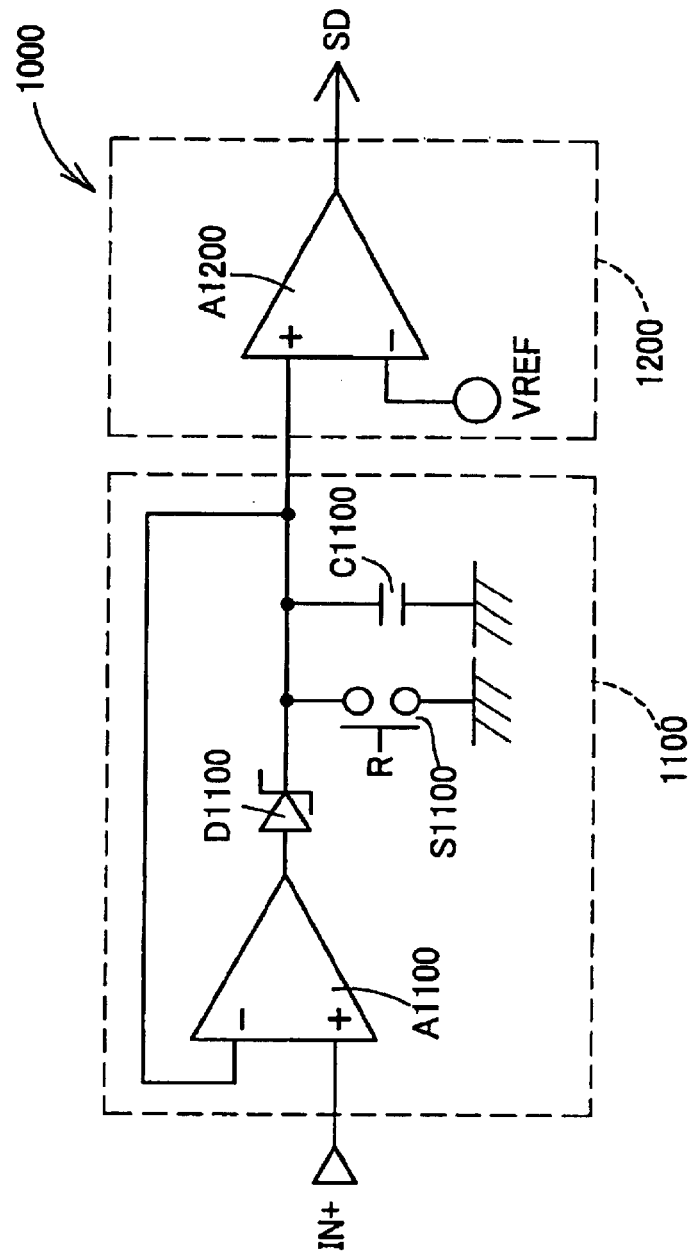
FIG. 27 is a circuit block diagram illustrating a signal detection apparatus according to the prior art.

A signal transmission apparatus 1 in the third embodiment shown in FIG. 8 has, in place of the configuration comprising the peak hold circuit 1100 to the voltage level detector 1200 in the signal transmission apparatus 1000 according to the prior art shown in FIG. 27, a voltage level detector 10 to which differential input signals IN+ and IN− are entered; a leading edge detecting circuit 30 for detecting the leading edge of the output signal L of the voltage level detector in state transition; a signal-detect setting circuit 50 and a signal-detect resetting circuit 70 based on an output signal EDG of the leading edge detecting circuit 30; and a signal-detect signal generating circuit 90 for supplying a signal-detect signal SD in response to output signals SET and RST from the setting/resetting circuits 50 and 70, respectively.

The voltage level detector 10 is configured of an analog circuit. The differential input signals IN+ and IN− are entered into this voltage level detector 10, which supplies a high level output signal L in response to differential inputs IN+ or IN− representing a difference in voltage amplitude level of or above a prescribed value. The output signal L is a logic signal. On the other hand, the elements from the leading edge detecting circuit 30 to the signal-detect setting circuit 50, the signal-detect resetting circuit 70 and the signal-detect signal generating circuit 90 are constituted of digital circuits. The leading edge detecting circuit 30 is a circuit to detect the edge of the rising state transition of the output signal L, which is a logic signal, of the voltage level detector 10 and to supply an edge detect signal EDG. The signal-detect setting circuit 50 outputs a signal detect set signal SET by detecting the edge-detect signal EDG a prescribed number of times within the first prescribed length of time counted with a clock signal CLK. The signal-detect resetting circuit 70 supplies a signal detect reset signal RST on condition that no edge detect signal EDG is detected within the second prescribed length of time counted with the clock signal CLK. The signal-detect signal generating circuit 90 sets the signal-detect signal SD in response to the signal detect set signal SET and resets the signal-detect signal SD in response to the signal detect reset signal RST.

Figure 9:
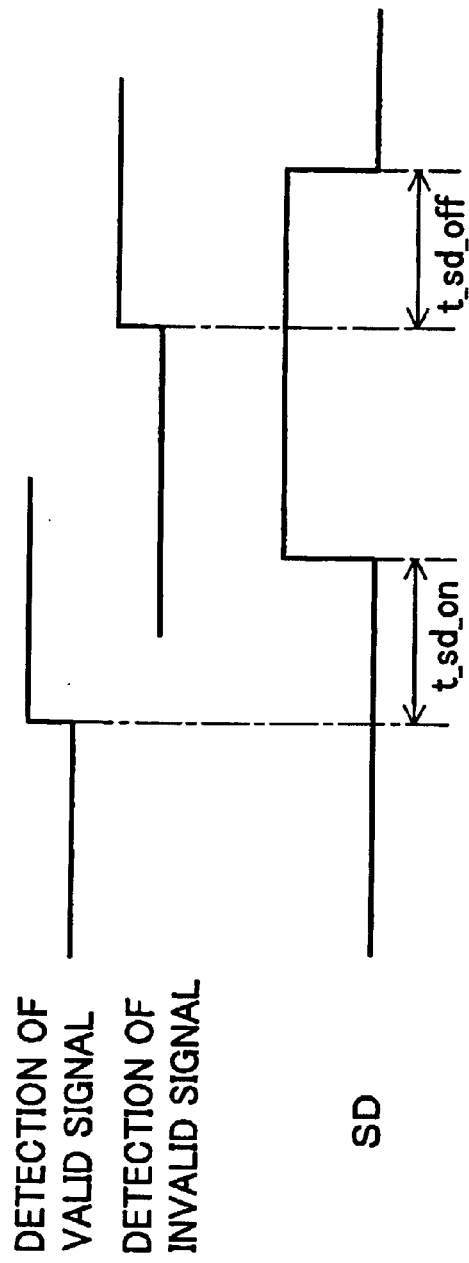
FIG. 9 is an explanatory diagram showing timing parameters of signal-detect signals according to the P1394b standard.

Hereupon, P1394b will be explained as an example of signal transmission standard. FIG. 9 shows the parameters of timing at which the signal-detect signal SD is outputted under the P1394b standard. The standard includes provisions on the delay time from the detection of a valid signal until the assertion of the signal-detect signal SD (t_sd_on) and the detection of an invalid signal until the negation of the signal-detect signal SD (t_sd_off), and prescribes 100 $\mu$sec as the maximum for each. The detection of a valid signal here can be set as the detection of the edge detect signal EDG a prescribed number of times, and this first prescribed length of time can be regarded as the delay time t_sd_on. Thus if the edge detect signal EDG is detected a prescribed number of times within the delay time t_sd_on, the signal-detect signal SD can be asserted. The detection of an invalid signal can be set as the failure to detect the edge detect signal EDG, and the second prescribed length of time then can be regarded as the delay time t_sd_off. Thus, if no edge detect signal EDG is detected within the delay time t_sd_off, the signal-detect signal SD can be negated.

Code tables of 8b10b codes, which constitute the coding system used under the P1394b standard, are presented in FIGS. 10 and 11. The 8b10b coding system, as shown in FIGS. 10 and 11, is a system of coding 8-bit data into codes of 10-bit length. Codes of 10-bit length are transmitted over the transmission path. Coding takes into account the number of bits "0" and the number of bits "1" in 10-bit length codes. Two kinds of codes are allocated for each set of 8-bit data, including 10-bit length codes having a greater number of bits "0" and 10-bit length codes having a greater number of bits "1". This is intended to maintain a DC balance in the voltage level on the transmission path. Variations in the DC voltage level on the transmission path are restrained by alternately transmitting a 10-bit length code having more of bits "1" and a 10-bit length code having more of bits "0". Further in order prevent the sensitivity of the transceiver on the transmission path from deteriorating, coding is done not to let the same bit value appear consecutively, and 10-bit length codes are set to allow no more than five bits of the same value to be consecutive in the 10-bit length-coded signals.

Also, the P1394b standard has a characteristic, distinct from other such standards, that radiation noise of a specific frequency is great on account of the consecutive sending of the same request packet signal in order to secure the right to use the bus. To reduce this noise, 8-bit data are scrambled by a spread spectrum system. In this manner, the same 8-bit data are subjected to arithmetic operation using a specific code to diffuse the bit pattern in a pseudo-at-random way, and the radiation noise is reduced by diffusing it over a wide frequency range.

Figure 12:
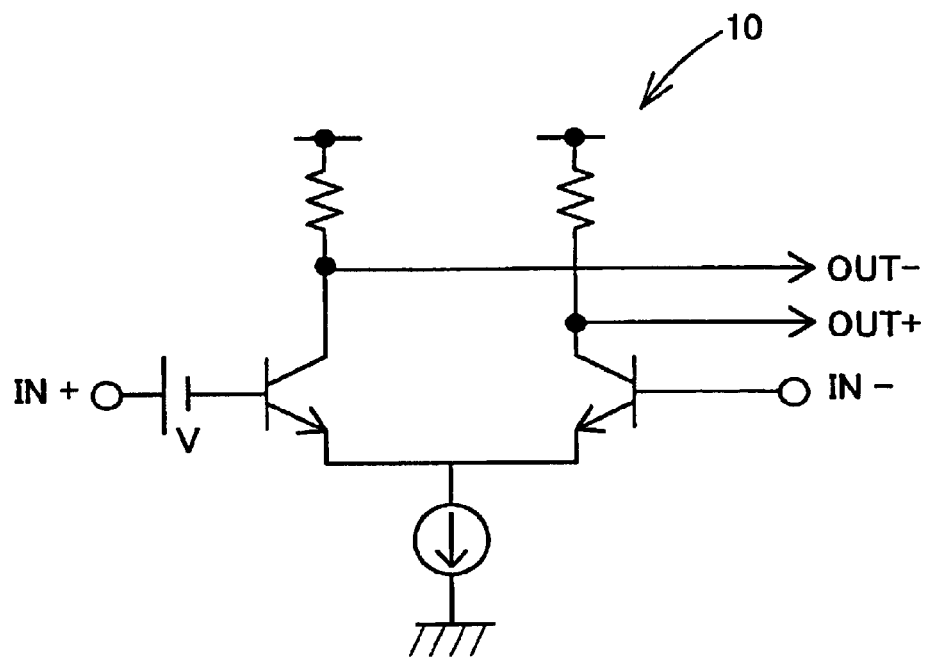
FIG. 12 is a circuit diagram illustrating a specific example of voltage level detector in the third embodiment.

What follows is a description in specific terms of a case in which the signal detection apparatus 1 in the third embodiment shown in FIG. 8 is applied to the P1394b standard, which is the next generation standard of IEEE 1394. FIG. 12 illustrates a specific example of the voltage level detector 10. This is a basic configuration of a differential circuit based on a differential pair in which the emitter terminals of bipolar transistors are connected. By providing a negative voltage level shift circuit V on the input signal IN+ input routes from the transmission path to the base terminal of the differential pair, it is made possible set an offset to the potential difference of the input signals IN+ and IN− between which the output signal of the differential circuit is inverted. This voltage level shift circuit V can set a prescribed value of the voltage amplitude level difference between the differential input signals IN+ and IN−. Although the voltage level shift circuit V is denoted in FIG. 12 by a symbol of a voltage source, it can be easily set by, for instance, a configuration in which a resistance element (not shown) is provided on the input route for the input signal IN+ from the transmission path, and a constant current is drawn with a constant current source (not shown) via this resistance element from the transmission path. If the insertion of a resistance element does not fit the impedance standard of the input to the differential circuit, it is possible to provide an emitter follower or source follower configuration (not shown) at the input stage, connect the resistance element via this configuration, and shift down the voltage level with the constant current source. Although the output signals are expressed in FIG. 12 as differential signals OUT+ and OUT−, a single phase output of a logic level can be obtained by connecting a known circuit configuration to a later stage than the differential output signals OUT+ and OUT−.

Though the voltage level detector 10 in FIG. 12 is configured of a bipolar transistor, obvious it can be constituted of a MOS transistor as well. In this case, if the differential signal output circuit 1A, 2A through 2D in the first or second embodiment are used as the voltage level detector 10, voltage overshooting and voltage undershooting in the differential output signals OUT+ and OUT− can be effectively restrained against high speed transition of the differential input signals IN+ and IN−.

Figure 13:
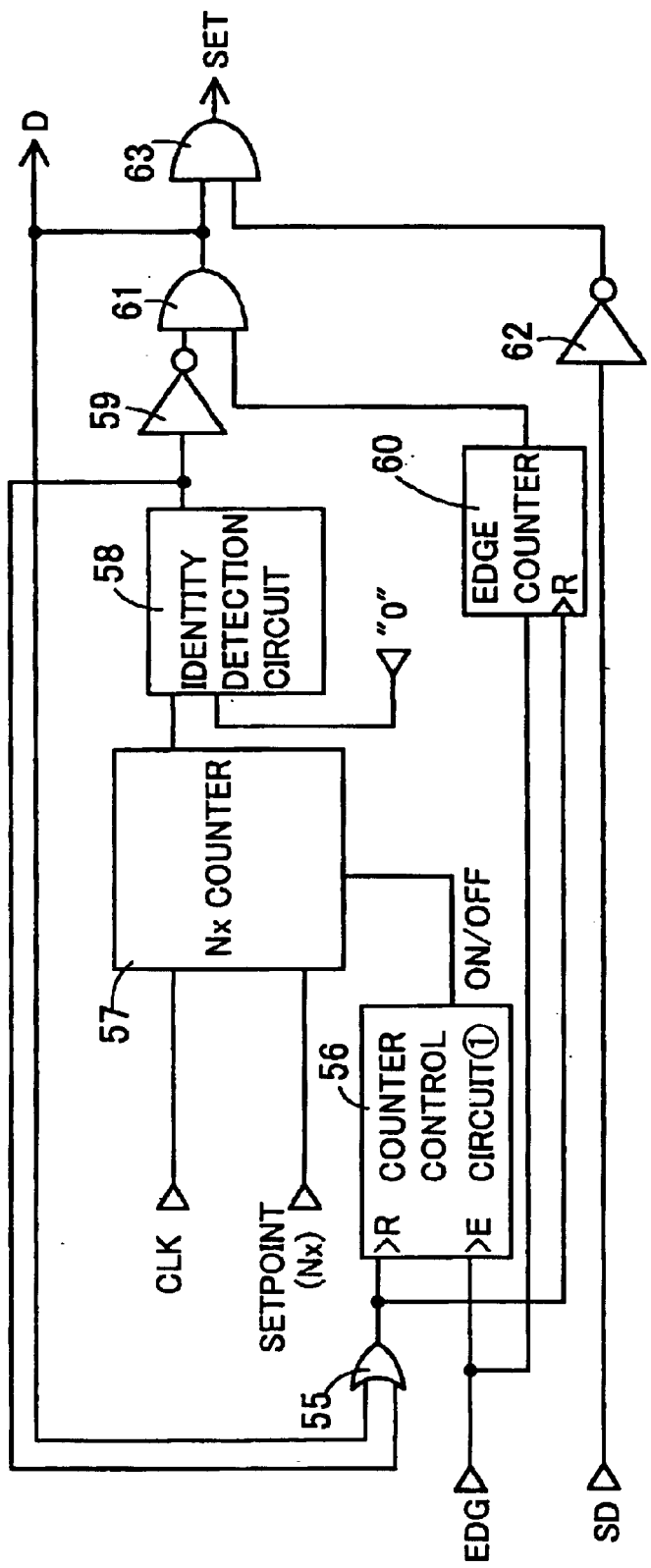
FIG. 13 is a circuit block diagram illustrating a specific example of signal-detect setting circuit in the third embodiment.

FIG. 13 illustrating a specific example of the signal-detect setting circuit 50. The edge detect signal EDG from the leading edge detecting circuit 30 is connected to the enable terminal E of a counter control circuit • 56, and also connected to an the edge counter 60. The output terminal of the counter control circuit • 56 is entered as an on/off signal into an Nx counter 57. Into the Nx counter 57, not only the clock signal CLK and a setpoint Nx, but also an output signal for supplying the count is connected to an identity detection circuit 58. A count "0" at the Nx counter 57 is entered into the identity detection circuit 58 as the reference, and the result of identity detection is inputted to one of the input terminals of an OR gate 55 and at the same time inputted to an inverter gate 59. A valid signal-detect signal D is outputted from an AND gate 61 which is connected to the output terminal of the inverter gate 59 and to the output terminal of an edge counter 60. The output signal of the edge counter 60 here is set in response to the number of times of identity detection by the edge detect signal EDG with a setpoint (not shown) and supplies a high level signal. The valid signal-detect signal D is connected to the other input terminal of the OR gate 55, and the output terminal of the OR gate 55 is disposed for inputting to the reset terminal R of the edge counter 60 and to the reset terminal R of the counter control circuit 56. The valid signal-detect signal D is entered into an AND gate 63 together with a signal deriving from the signal-detect signal SD via an inverter gate 62, and the signal detect set signal SET is supplied from the AND gate 63.

The operation of the signal-detect setting circuit 50 illustrated in FIG. 13 will be described with reference to state transition diagram of FIG. 15. In the "idle" state IDL in FIG. 15, there is a state permitting acceptance of the edge detect signal EDG at its high level. Upon acceptance of a high level edge detect signal EDG here, the state transitions into a state of having accepted the first edge detect signal EDG (first edge). Referring to the circuit diagram of FIG. 13, when a high level edge detect signal EDG is entered, this is matched by the supply of an "on" signal from the counter control circuit • 56.

This "on" signal is entered into the Nx counter 57, which takes in the "on" signal in synchronism with the clock signal CLK and starts counting. From the "first edge" state in FIG. 15, the count increases by 1 at a time in synchronism with the clock signal CLK (from the "1" state till the "Nx" state in FIG. 15). The count-up continues until the count becomes identical with the setpoint Nx, when the count is reset to its initial value "0" at the next clock signal CLK. When the count is initialized to "0", the output signal of the identity detection circuit 58 takes on a high level, and is entered into the OR gate 55 to reset the counter control circuit • 56. The Nx counter 57 is placed in a reset state in synchronism with the clock signal CLK of the next cycle. Thus it returns to the idle state IDL. The setpoint Nx here is given from outside the Nx counter 57, and can be altered as appropriate.

When the edge detect signal EDG takes on a high level at one of the timings of the count-up operation by the Nx counter 57 and the leading edge of the output signal of the voltage level detector 10 is detected, the edge counter 60, deciding that the edge has been detected a prescribed number of times (twice in this case), sets the output terminal, and supplies a high level signal. On the way of count-up by the Nx counter 57, the output of the Nx counter 57 is a count other than "0". Therefore, a signal deriving from the output signal of the identity detection circuit 58 via the inverter gate 59 maintains a high level. As a result, the valid signal-detect signal D, which is the output signal of the AND gate 61 is at a high level. At this point of time, the signal-detect signal SD is at a low level, and the output terminal of the inverter gate 62 is at a high level. Both input terminals of the AND gate 63 take on a high level, and the signal detect set signal SET is set to a high level (the "set" state in FIG. 15).

Simultaneously with the outputting of the signal detect set signal SET, the valid signal-detect signal D resets the edge counter 60 and the counter control circuit • 56 via the OR gate 55, and the Nx counter 57 is reset in synchronism with the clock signal CLK of the next cycle to initialize the count to "0". This count "0" is recognized for identity detection by the identity detection circuit 58, which then supplies an output signal of a high level. One of the input signals to the AND gate 61 takes on a low level via the inverter gate 59; the valid signal-detect signal D takes on a low level; and the signal detect set signal SET also returns to a low level. On the other hand, as the high level of the signal detect set signal SET causes the signal-detect signal generating circuit 90 to raise the signal-detect signal SD to a high level, the output signal of the inverter gate 62 is fixed to a low level not to accept any more valid signal-detect signal D (the "wait" state in FIG. 15). If in this state the signal detect reset signal RST, to be described in more detail afterwards, causes the signal-detect signal SD to take on a low level via the signal-detect signal generating circuit 90, the idle state IDL, in which the edge detect signal EDG can be accepted, will be resumed. To add, though the setpoint of the edge counter 60 is 2 in the state transition diagram of FIG. 15, so that, if the edge detect signal EDG is supplied twice, the output signal is set to output a high level, it is also possible to use a configuration in which the count can be set as desired.

Figure 14:
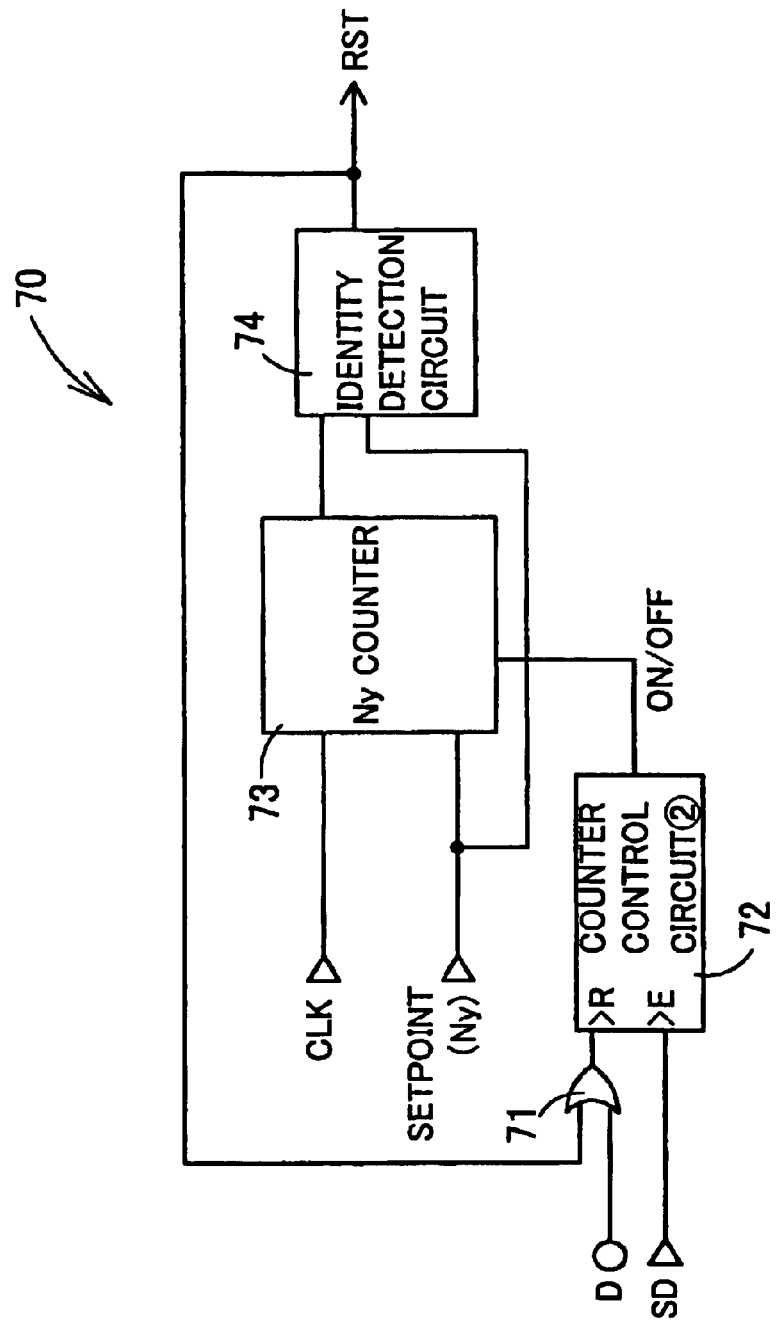
FIG. 14 is a circuit block diagram illustrating a specific example of signal-detect resetting circuit in the third embodiment.

FIG. 14 illustrates a specific example of the signal-detect resetting circuit 70. The valid signal-detect signal is inputted to one of the input terminals of an OR gate 71 and its output terminal is arranged for inputting to the reset terminal R of a counter control circuit • 72. To the enable terminal E of the counter control circuit • 72 is inputted the signal-detect signal SD. The output terminal of the counter control circuit • 72 is disposed for entry of on/off signals into an Ny counter 73. Into the Ny counter 73 are entered the clock signal CLK and a setpoint Ny, and the output signal indicating the count is connected to an identity detection circuit 74. The setpoint Ny is entered into the identity detection circuit 74 as the reference, and the result of identity detection is connected to the other input terminal of the OR gate 71 and supplied as the signal detect reset signal RST.

The operation of the signal-detect resetting circuit 70 illustrated in FIG. 14 will be described with reference to the state transition diagram of FIG. 16. In the idle state IDL of FIG. 16, when a high level signal-detect signal SD is entered into the enable terminal E, the counter control circuit • 72 supplies an "on" signal to the Ny counter 73, and a state of having detected a signal (the "signal detect" state in FIG. 16) is reached. After this "on" signal, the Ny counter 73 starts counting in synchronism with the clock signal CLK that is entered into the Ny counter 73. From the "signal detect" state in FIG. 16, the count increases by 1 at a time in synchronism with the clock signal CLK (from the "1" state till the "Ny" state in FIG. 16). The count-up continues until the count becomes identical with the setpoint Ny, when the identity detection circuit 74 supplies the signal detect reset signal RST. The signal detect reset signal RST resets the counter control circuit • 72 via the OR gate 71, and supplies an "off" signal to the Ny counter 73 as the output signal of the counter control circuit • 72. The Ny counter 73 is reset and returns to the idle state IDL. The setpoint Ny here is given from outside the Ny counter 73, and can be altered as appropriate.

When the valid signal-detect signal D takes on a high level at one of the timings of the count-up operation by the Ny counter 73, and a valid signal is detected by the signal-detect setting circuit 50, the counter control circuit • 72 is reset via the OR gate 71, the Ny counter 73 is reset, and state of having detected a signal (the "signal detect" state in FIG. 16) is resumed. In this case, as the signal-detect signal SD is at a high level, the counter control circuit • 72, again placed in the "enable" state, supplies an "on" signal from the output terminal to the Ny counter 73. In synchronism with the clock signal CLK, the Ny counter 73, after being reset, resumes the count-up operation (the "signal detect" state in FIG. 16).

FIGS. 17 through 19 are time charts of the operational sequences of the signal-detect signal SD shown in FIGS. 13 through 16. In FIGS. 17 through 19, the differential input signals IN+ and IN−, which are the input/output signals of the voltage level detector 10, the output signal L and the signal-detect signal SD representing the result of signal detection are taken up. To add, FIGS. 17 and 18 illustrate a case in which the leading edge of the output signal L of the voltage level detector 10 is detected in synchronism with the switching cycle of the input signals IN+ and IN−, wherein the period of the clock signal CLK for the counting by the Nx counter 57 is synchronized with the switching cycle of the input signals. Signal detection here covers only the cases in which the input signal IN+ is at a higher level than the input signal IN−.

Signal (1) in FIG. 17 shows a case in which the cycle in which the potential difference between the differential input signals IN+ and IN− reaches a prescribed value occurs in only one bit length. When the differential input signals IN+ and IN− have come to manifest a prescribed voltage difference, the voltage level detector 10 supplies an output signal L of a high level, and the leading edge detecting circuit 30 supplies the edge detect signal EDG. This places the counter control circuit • 56 in the enable state, actuating the Nx counter 57 to start counting up. However, because no succeeding edge is detected with a prescribed length of time Xns, which is a period for counting Nx times, the output signal of the edge counter 60 maintains a low level, but no valid signal-detect signal D is set. Therefore, the signal detect set signal SET is not set, and the signal-detect signal SD maintains a low level. As the output signal of the Nx counter 57 takes on a low level after counting Nx, the counter control circuit • 56 is reset via an inverter gate 54 and an "off" signal is delivered to the Nx counter 57. The count-up action is stopped upon resetting of the count, and the idle state IDL is resumed. Only one bit has been judged valid in the input signals IN+ and IN−, and no succeeding signal is detected. Therefore, what appears to be a detect signal of one bit length obtained here is judged to be noise.

Signals (2) and (3) in FIG. 17 represent a case in which the potential difference between the differential input signals IN+ and IN− has surpassed a prescribed value for two bits with one bit intervening between them. When the differential input signals IN+ and IN− manifest a prescribed voltage difference, the voltage level detector 10 gives an output signal L of a high level, and the leading edge detecting circuit 30 supplies the edge detect signal EDG. At the first bit the edge detect signal EDG is supplied, and the counter control circuit • 56 is placed in the enable state, actuating the Nx counter 57 to start counting up. At the next bit but one, the edge detect signal EDG is again given. As the interval between the leading edges of two bits with one intervening bit between them is usually short enough relative to the P1394b standard on the t_ad_on time, it can be considered a length of time within the prescribed length of time Xns for counting Nx times. Therefore, the output signal of the Nx counter 57 maintains a high level and, with the output signal of the inverter gate 59 continuing to maintain a high level, the output signal of the edge counter 60 also takes on a high level. If the valid signal-detect signal D is set and the signal-detect signal SD is not to set to a high level, the signal-detect signal SD will be set to a high level. Referring to FIG. 17, the clock signal CLK synchronized with the leading edges of the input signals IN+ and IN− causes the signal-detect signal SD to be set in synchronism with a second output signal L. As the signal-detect signal SD is already entered into the AND gate 63 via the inverter gate 62, the valid signal-detect signal D is masked by the AND gate 63, and no subsequent valid signal-detect signal D can be accepted. In the input signals IN+ and IN−, the leading edges of two bits with one intervening bit between them can be detected, and as this edge interval is a length of time within the prescribed length of time Xns for counting Nx times, it is judged that a valid signal has been detected.

Signals (4) and (5) in FIG. 18 represent a case in which, though two bits of the cycle in which the potential difference between the differential input signals IN+ and IN− reaches a prescribed value are detected, the time interval is not within the prescribed length of time Xns for the counting of Nx by the Nx counter. Whereas the Nx counter 57 starts counting up the output signal L, which is signal (4), the Nx counter completes counting Nx before the edge detect signal EDG, which is the next signal (5). Therefore, the output count of the Nx counter 57 is "0", resulting in a high level of the output of the identity detection circuit 58. The edge counter 60 and the counter control circuit • 56 are reset via the OR gate 55 to reset the count of the Nx counter 57. At the same time, the operation is stopped to return to the idle state IDL. Accordingly, what appears to be signal (5) of an output signal L is judged to be noise. Incidentally, output signal (4) is detected as a valid signal if its time interval from the preceding output signal L is not longer than Xns.

Signal (6) in FIG. 18 represents a case in which the cycle for the potential difference between the differential input signals IN+ and IN- to reach a prescribed value has two consecutive bits, and in signal (7) the cycle has more than two consecutive bits. As a 1-bit equivalent of inverted signal intervenes between the two signals, the edge interval between signals (6) and (7) is three bits long. As the leading edge interval between these bits is usually short enough relative to the P1394b standard on the t_sd_on time, it can be considered a length of time within the prescribed length of time Xns for counting Nx times. Therefore, a leading edge attributable to the second bit signal is detected on the way of counting by the Nx counter having started counting up upon the detection of the first edge, and it is judged that a valid signal has been detected.

The operation of the signal-detect resetting circuit 70 is in a state of having detected a signal (the "signal detect" state in FIG. 16) because the signal-detect signal SD is at a high level. Then the valid signal-detect signal D detected by signal (4) and the preceding signal of signal (4) is entered, and the counter control circuit • 72 is reset. The Ny counter 73 resumes counting up after its count is reset. It is at the timing of the detection of the leading edge of signal (7) as mentioned above that the valid signal-detect signal D is entered again. If after the restart of the Ny counter 73 by signal (4) a prescribed length of time Yns in which the count reaches Ny has not been attained, the count is less than Ny, and there is no detection of identity with the setpoint Ny. Therefore, no signal detect reset signal RST is supplied, the counter control circuit • 72 resets the Ny counter 73 to restart counting the prescribed length of time Yns.

Signals (8) and (9) in FIG. 19 represent a case in which the time interval in which the potential difference between the differential input signals IN+ and IN- reaches a prescribed value does not exist in the prescribed length of time Xns for the counting of Nx by the Nx counter. As in the case of signals (4) and (5) in FIG. 18, what appears to be signal (9) is judged to be noise.

Since signal (9) is judged to be noise, it is at the timing of signal (8) that the signal-detect signal SD is supplied. Therefore, the count of the Ny counter 73 is reset by signal (8), and counting is resumed. Since what appears to be signal (9) that is detected in the meantime is judged to be noise and no output signal L is detected either, the Ny counter 73 continues counting up until the setpoint Ny. When the count has reached Ny, the signal detect reset signal RST, which is the output signal of the identity detection circuit 74, comes out at a high level, and the signal-detect signal generating circuit 90 resets the signal-detect signal SD. Actions for failure to detect a signal takes place because no valid signal has been detected within the prescribed length of time Yns.

Next, a signal detection apparatus 2 in the fourth embodiment of the invention is shown in FIG. 20. The signal detection apparatus 2 has a configuration in which centering on a central processing unit (CPU) 22, a communication interface 21 is connected via a bus 28, and a memory 23, a magnetic disk unit 24, a cathode ray tube (CRT) 25, a keyboard 26 and a external memory medium drive unit 27 are connected to one another, with an external memory medium 29, such as a CD-ROM or a magnetic medium, further being detachably installed in the external memory medium drive unit 27. To the communication interface 21 is connected a signal transmission path for the serial bus, such as a twisted pair cable.

In the flow charts of a signal detection method to be described below, shown in FIGS. 21 and 22, the signal detection method realized in the signal detection apparatus 1 in the third embodiment is shown. If the flows charted here are incorporated into a program, the method can be executed by the signal detection apparatus 2 as well. In this case, the program is recorded in the memory 23 and/or the magnetic disk unit 24 within the signal detection apparatus 2, or if recorded on the external memory medium 29 such as a CD-ROM or a magnetic medium, will be recorded via the external memory medium drive unit 27 and further via a telecommunication line such as the Internet (not shown) into the memory 23 and/or the magnetic disk unit 24 or directly transferred to the CPU 22. Telecommunication line such as the Internet (not shown) here is provided for interfacing with communication media including a wired public telephone line, a wireless common carrier line for mobile telephones and the like and a wired or wireless leased line, and may as well be connected to the signal transmission path via the communication interface 21.

Parameters including setpoints on the Nx counter 57, the Ny counter 73 and the edge counter and the prescribed potential difference between the differential input signals IN+ and IN- in the voltage level detector 10 can be set into the signal detection apparatus 1 by an input unit (not shown). They can also be inputted into the signal detection apparatus 2 from the keyboard 26 while the operator confirms the inputs on the CRT 25. Where they are recorded on the magnetic disk unit 24 or the external memory medium 29 such as, a CD-ROM or a magnetic medium, they are reference as necessary in accordance with an instruction from the CPU 22 along with the processing of the program.

The flows of the signal detection method will be described below in specific terms with reference to FIGS. 21 and 22. FIG. 21 charts the flow of setting the signal-detect signal SD. At processing step (hereinafter abbreviated to S) 1, the presence of the leading edge of the signal waveform based on the input signals IN+ and IN- entered from the voltage level detector 10 or via a communication interface is checked (S1 • NO), and if it is detected (S1 • YES) the edge detection count is increased by 1 at a time (S2). If then the Nx counter for measuring the prescribed length of time for edge detection is not counting (S3 • NO), it starts counting (S4) to return to the edge detection state (S1). If it is counting (S3 • YES), it further judges whether or not edge detection has reached the prescribed number of times (S5). If the prescribed number of times has not been reached (S5 • NO), the count of the Nx counter is determined (S6). If the Nx count has been reached (S6 • YES), the edge counter is reset (S12) and the Nx counter is also reset (S7). If the Nx count has not been reached (S6 • NO), detection of the leading edge is continued as it has been (S1).

If edge detection has reached the prescribed number of times (S5 • YES), the entered signal is judged to be a valid input signal and the valid signal-detect signal D is supplied (S8) to reset the edge counter (S13) and also to reset the Nx counter (S9). Next it is judged whether or not the signal-detect signal SD is set (S14). If the signal-detect signal SD is not set (S14 • NO), the signal detect set signal SET is set (S10). If it is set (S14 • YES), the signal detect set signal SET need not be set, the leading edge detection state is resumed to detect the next valid signal-detect signal D (S1).

FIG. 22 charts the flow of resetting the signal-detect signal SD. At S12, it is checked whether or not the signal-detect signal SD is supplied (S12 • NO) and, if this signal is detected (S12 • YES), the Ny counter for measuring the prescribed length of time to judge non-detection of the input signals IN+ and IN− starts counting up (S13). It is judged whether or not the valid signal-detect signal D is detected, which would indicate detection of a valid signal during the count-up operation (S14). If it is detected (S14 • YES), the Ny counter is reset (S15) and counting is restarted (S13). If it is not detected (S14 • NO), the count of the Ny counter is further checked (S16). If the Ny count has not been reached (S16 • NO), the process returns to the S14 of valid signal-detect signal D detection to continue the detection attempt. If the Ny count is reached (S16 • YES), the signal detect reset signal RST is set (S17), and the Ny counter is reset (S18) to complete the flow of signal-detect signal SD resetting.

As hitherto described in detail, in the signal detection apparatus 1 and the signal detection method in the third embodiment (FIGS. 21 and 22), the leading edge detecting circuit 30 for detecting any state transition of the output signal L of the voltage level detector 10, the signal-detect setting circuit 50 for signal confirmation, the signal-detect resetting circuit 70 for non-signal confirmation and the signal-detect signal generating circuit 90 for generating detect signals can be configured of logic circuits except the voltage level detector 10 for comparing the voltage amplitude level of the input signals IN+ and IN− with a prescribed voltage REF. Accordingly the circuit operation can be realized with reduced current consumption if a digital integrated circuit, such as a CMOS-LSI, is used. Less power consuming operation can be realized in the signal detection apparatus 1 and the signal detection method in the third embodiment (FIGS. 21 and 22). Where this system is used in a battery-powered system such as portable equipment, it will prove suitable for continuous use for many hours, ease the problem of heat generating in IC packaging, and thereby make possible high density mounting.

The count frequencies and setpoints (Nx and Ny) of the Nx and Ny counters 57 and 73 for setting first and second prescribed lengths of time for signal confirmation and non-signal confirmation can be appropriately set in accordance with the detection period standard allocated for signal detection, and it is not absolutely necessary to accomplish signal detection in a length of time matching the high signal transfer speed. Therefore, the clock signal CLK for determining the count frequencies of the Nx and Ny counters can be caused to operate at a low frequency relative to the high signal transfer speed. A high frequency clock circuit or the like, such as a PLL circuit, which would be required if the operation should match the signal transfer speed can be dispensed with. Less power consuming operation can be realized in the signal detection apparatus 1 or the signal detection method (FIGS. 21 and 22). These systems can be suitably used in a battery-powered system such as portable equipment.

Especially under the P1394b standard, whereas high speed transmission standards including the S800 standard calling for 800 Mbps and the S3200 standard calling for 3.2 Gbps are formulated, because the signal detection apparatus 1 and the signal detection method (FIGS. 21 and 22) are realized with a digital integrated circuit such as a CMOS-LSI, less power consuming operation can be realized. Furthermore, it is made possible to integrate circuits into what is known as a system LSI, so that the signal detection apparatus 1 and the signal detection method (FIGS. 21 and 22) in high density packaging, meeting or compliant with the P1394b standard can be provided.

Further, the P1394b standard, as shown in FIG. 9, includes provisions on the delay time from the detection of a valid signal until the assertion of the signal-detect signal SD (t_sd_on) and the detection of an invalid signal until the negation of the signal-detect signal SD (t_sd_off), and prescribes 100 $\mu$sec as the maximum for each. Therefore, the count frequencies and setpoints (Nx and Ny) for the Nx counter 57 of the signal-detect setting circuit 50 and the Ny counter 73 of the signal-detect resetting circuit 70 can be appropriately set to be compatible with this standard. Thus signal detection can be accomplished at a lower frequency relative to the high signal transfer speed of the S800 or S3200 standard. A high frequency circuit, such as a PLL circuit, which would be required if the operation should match the signal transfer speed can be dispensed with, and less power consuming operation can be realized. These systems can be suitably used in a battery-powered system such as portable equipment.

Further, the P1394b standard calls for 8b10b coding for signal transmission. In 8b10b coding, no more than five bits of the same bit value appear consecutively in 10-bit length codes propagating over a transmission path. Therefore, the maximum length of time in which any state transition occurs at the time of bit value switching is determined. For instance under the S800 standard (800 Mbps), the bit length is 1 ns because bit signals of 1 Gbps are transmitted after coding, and the maximum length of time in which any state transition occurs is 5 ns (200 MHz). Thus, during an attempt at signal detection, if no state transition is detected within the maximum length of time (5 ns under the S800 standard), the seeming input signal in which the first state transition is detected can be judged to be noise.

Therefore, according to the standard on the transmission of 8b10b-coded signals any state transition of input signals can occur within the prescribed period of no longer than five bits and the maximum length of time in which state transition is repeated is determined. As the number of state transitions (count Nx) that can be detected by the leading edge detecting circuit 30, which is the detector, within a period of time counted by the Nx counter 57, which is the first time counter, is determined, by using the signal detection apparatus 1 or 2, or the signal detection method (FIGS. 21 and 22), it is possible to accurately judge whether or not a seeming input signals IN+ and IN− is a valid signal or noise by checking whether or not a prescribed number of state transitions are detected within a first prescribed length of time, which is the delay time (t_sd_on) from the detection of a valid signal until the assertion of the signal-detect signal SD according to the P1394b standard.

Or if signal detection is carried out by detecting any state transition with respect to a prescribed combination of the input signals IN+ and IN−, there is no need to have all the signals transmitted at a high signal transfer speed samples by the voltage level detector 10 or at the level detection step for detecting the voltage amplitude level of the input signals IN+ and IN−. Accordingly, the voltage level detector 10 or the level detection step can be configured to operate at a lower speed than the signal transfer speed, and this feature enables less power consuming operation to be realized. It can be suitably used in a battery-powered system such as portable equipment.

In particular under the P1394b standard, in the code tables of 8b10b codes shown in FIGS. 10 and 11, two kinds of codes are allocated for each set of 8-bit data, including a 10-bit length code pattern having a greater number of bits "0" and a 10-bit length code pattern having, conversely, a greater number of bits "1" with a view to maintaining a DC balance in the voltage level on the transmission path. Among the 10-bit length codes, the voltage level detector 10 or the level detection step involves 46 patterns in which the bit length of bits "1" including the leading edge is not consecutive (patterns in bold italic characters in FIGS. 10 and 11). They include 12 patterns in which the number of bits "0" and the number of bits "1" are equal (patterns in shadowed bold italic characters in FIGS. 10 and 11). In each of these 12 patterns, mutually inverse bits "0" and bits "1" are paired to match one set of 8-bit data. Therefore, before coding, they are six patterns of 8-bit data, i.e. 8-bit data patterns of 52$h$, 92$h$, A2$h$, AAh, ACh and ADh. In the 34 patterns remaining after the subtraction of these 12 out of the total of 46 patterns, the number of bits "1" is smaller than that of bits "0".

On the basis of the foregoing, 10-bit length codes to be transmitted in accordance with the P1394b standard will be discussed. Since there are two kinds for 10-bit length codes for each set of 8-bit data, the number of 10-bit length codes is 256×2=512. Since only 46 codes out of this total are codes in which bits "1" do not appear consecutively, the number of codes in which bits "1" appear consecutively for a 2-bit length or more is 512−46=466. Thus, more than 90% of all the 10-bit length codes have a part in which two or more bits "1" are consecutive. Further, 34 out of the 46 are codes in which the number of bits "0" is greater and bits "1" are not consecutive. However, according to the P1394b standard, in order to maintain a DC balance on the transmission path, the number of bits "1" is greater in the 10-bit length code to be transmitted next. Thus, a code immediately following any one of the 34 has at least two consecutive bits "1". The remaining 12 codes include only six kinds of 8-bit data and account for only 2% of the total of 256 kinds of data. Moreover, as 8-bit data are scrambled by a spread spectrum system, it is unthinkable for any two or more of these six 8-bit patterns to emerge consecutively.

Because of the foregoing, if a bit data string of 10-bit length codes in units of an appropriate byte length of two bytes or more each is looked at, the probability of the emergence of a part in which bits "1" are consecutive is rather high. Considering that the delay time (t_sd_on) until the assertion of the signal-detect signal SD and the delay time (t_sd_off) from the detection of an invalid signal until the negation of the signal-detect signal SD are 100 $\mu$sec each at the maximum under the P1394b standard, a valid signal can be detected without fail by detecting the leading edge when two or more bits "1" emerge consecutively in a data length of two bytes or more.

Therefore, the voltage level detector 10 has only to detect a part in which two or more bits "1" emerge consecutively. By optimizing the detection sensitivity of the voltage level detector 10, the need to follow a high data transfer speed of the S800 standard or the like is eliminated, and the designing of the voltage level detector 10 is thereby facilitated, resulting in less current consuming operation by the voltage level detector 10, which in turn makes important contributions to less power consuming operation by the signal detection apparatus 1.

It is sufficient to suitably set the Nx counter 57 and the Ny counter 73 for measuring the first and second prescribed lengths of time for signal confirmation and non-signal confirmation in accordance with the standard detection period allocated for signal detection, but signal detection need not be accomplished in a length of time matching a high signal transfer speed. Therefore, the clock signal CLK according to which the Nx counter 57 and the Ny counter 73 are to operate may be operate at a lower speed than the signal transfer speed, and it is thereby made possible for the Nx counter 57 and the Ny counter 73, which are the first and second time counters in the signal detection apparatus 1, or represent the first and second time counting steps in the signal detection method, to operate with reduced current consumption. This arrangement can be suitably used in a battery-powered system such as portable equipment.

The signal detection apparatus 2 and signal detection method in the fourth embodiment (FIGS. 21 and 22) can provide the same advantages as the signal detection apparatus 1 in the third embodiment. In addition, steps for executing a method of detecting valid signals in signal transmission over a serial bus BB (FIGS. 21 and 22) as a computer-readable program, besides being recorded in the memory 23 and/or the magnetic disk unit 24 within the signal detection apparatus 2, where they are recorded on the external memory medium 29 such as a CD-ROM or a magnetic medium, can be stored into the memory 23 or the magnetic disk unit 24 via the external memory medium drive unit 27 and further via a telecommunication line such as the Internet (not shown), or directly transferred to the CPU 22 to be executed as instructed by the CPU 22. Further by fitting this program to the P1394b standard, the signal detection apparatus 2 can be made usable as a detection device for valid signals in signal transmission over the serial bus BB meeting or compliant with the P1394b standard.

Furthermore, because a sequence of steps (FIGS. 21 and 22) can be stored in a computer-readable program, it can recorded on various recording media or flexibly distributed and installed by recording it on the external memory medium 29 such as a CD-ROM or a magnetic medium or downloading it via a telecommunication line such as the Internet.

Typical systems are described below. An example of differential signal transmission system shown in FIG. 23 uses the differential signal output circuit 1A or 2A through 2D in the first and second embodiments as a drive circuit for a twisted pair cable TP under the IEEE 1394b standard. By the use of the differential signal output circuit 1A or 2A through 2D, it is made possible to provide a differential signal transmission system capable of preventing transitional voltage overshooting and/or voltage undershooting from occurring at the differential output terminals OUT and OUTX during differential input signals switching, and stably transmitting high speed differential signals over the twisted pair cable TP.

Another example of signal transmission system configuration illustrated in FIG. 24, using the signal detection apparatus 1 or 2 or the signal detection method (see FIGS. 21 and 22) in the third and fourth embodiments as the interface, configures n+1 apparatuses comprising apparatuses A through H (ID=0 through 7) over the serial bus BB and other apparatuses not shown (ID=8 through n) according to the P1394b serial bus system. An interface according to P1394b can configure a system by assigning ID numbers to the constituent apparatuses. In each individual apparatus, the signal detection apparatus 1 or the signal detection apparatus 2 is configured in the interfacing part with the serial bus BB, and in addition to these apparatuses there is provided as software or firmware an interface for realizing the signal detection method shown in the flow charts of FIGS. 21 and 22. The presence of these signal detection apparatuses 1 and 2 or the signal detection method in the interfacing part enables each apparatus to detect valid signals out of the signals on the serial bus BB and makes possible communication via the P1394b interface.

As the signal detection apparatuses 1 and 2 or the signal detection method (FIGS. 21 and 22) provided in the interfacing part with the serial bus BB can be configured of logic circuits, the circuit operation with reduced current consumption can be realized for the signal transmission system (FIG. 24) if a digital integrated circuit, such as a CMOS-LSI, is used. Where this signal transmission system is used in a battery-powered system such as portable equipment, it will prove suitable for continuous use for many hours, ease the problem of heat generating in IC packaging, and thereby make possible high density mounting.

Further, if the standard on the detection time allocated for signal detection on the serial bus BB is satisfied, it is not absolutely necessary for signal detection to be accomplished in a length of time matching a high signal transfer speed. Therefore, the clock signal CLK to determine the count frequencies of the Nx and Ny counters can be caused to operate at a lower frequency relative to the signal transfer speed, and less power consuming operation can be realized in the signal transmission system (FIG. 24). This signal transmission system can be suitably used in a battery-powered system such as portable equipment.

If software or firmware to realize the signal detection apparatuses 1 and 2 or the signal detection method configured in the interfacing part with the other apparatuses (apparatuses A through H and others) with the serial bus BB are constituted to be compatible with the P1394b standard, the signal transmission system shown in FIG. 24 can be configured as an interface conforming to the P1394b standard.

If the serial bus BB in FIG. 24 is configured of a twisted pair cable TP, the interfaces of the apparatuses A through H (ID=0 through 7) and other apparatuses (ID=8 through n) in the signal transmission system shown in FIG. 24 can be configured of the signal detection apparatuses 1 and 2 and the differential signal output circuits 1A and 2A through 2D. It is further possible to configure the drive circuit for the serial bus BB, such as a twisted pair cable, connected to the voltage level detector 10 in the signal detection apparatus 1 and the communication interface 21 in the signal detection apparatus 2 of the differential signal output circuits 1A and 2A through 2D.

The present invention is not limited to the above-described first through fourth embodiments, but obviously various improvements and modifications are possible within a scope not deviating from the essentials of the invention.

Although the first and second embodiments were described with respect to examples configured of MOS transistor, the invention is not limited to them, but can be similarly applied to examples configured of bipolar transistors or appropriate combinations of MOS transistors and bipolar transistors.

Also, with respect to the first and second embodiments, cases in which the capacitor to constitute a transitional current path is connected to the current source, the power supply voltage or the ground voltage were described, the invention is not limited to these cases, but the capacitor can as well be connected to a low impedance node or a current supply unit having a sufficiently large current supply capacity. For instance, connection to a buffer output such as a source follower or an emitter follower or an internal power source or some other low impedance node can give a similar effect. It is also possible to use a current source in another circuit configuration permitting the flow of a large current.

It is thereby possible to secure a sufficient supply capacity for the transitional current and to securely restrain voltage variations at the connection nodes between differential pairs and current sources. Accordingly, voltage overshooting and/or voltage undershooting at the differential output terminals can be restrained without fail.

Furthermore, with respect to the differential signal output circuit 100 according to the prior art, a case of connecting the nodes N1 and N2 with a capacitor in the first embodiment was referred to, it is also possible to connect a first capacitor between the node N1 and the ground voltage GND and a second capacitor between the node N2 and the power supply voltage VDD.

Further in the third embodiment, as shown in FIGS. 15 and 16, the cycle period of the clock signal CLK for counting by the Nx and Ny counters 57 and 73 are set short relative to the time until the Nx count and the Ny count, which are the respectively prescribed lengths of time, the signal detection apparatus, signal detection method, signal transmission system and computer-readable program according to the invention are not limited to this setting, but the frequency of the clock signal CLK can as well be set low. In this case, the clock signal CLK will operate for signal confirmation or non-signal confirmation after the prescribed lengths of time are reached.

In the third and fourth embodiments, the configurations are such that the leading edge is detected when the input signal IN+ has reached a higher voltage level than the prescribed value relative to the input signal IN−, the invention is not limited to this configuration, but a configuration in which the trailing edge is detected when the input signal IN+ has reached a lower voltage level than the prescribed value relative to the input signal IN− is also acceptable, or both edges can as well be made the objects of detection.

Although a case in which a twisted pair cable is used for the transmission of differential input signals was referred to, the invention is not limited to this, but it can be similarly applied to a case in which a coaxial cable is used or one in which an optical fiber cable is used. In these cases, the input signals may conceivably be single phase signals instead of differential signals or optical signals instead of electrical signals, and to these cases as well the invention is made applicable by providing an input buffer capable of appropriately detecting the levels of input signals.

Although the P1394b standard was cited with respect to the first through fourth embodiments, this is not the only compatible standard, but obviously the invention can as well be applied to a next generation communication interface for realizing even faster transmission.

According to the present invention, it is possible to provide a differential signal output apparatus capable of realizing stable high speed differential input signal switching by restraining the voltage overshooting and/or undershooting at differential output terminals due to timing lags of differential input signals owing to lags in response characteristics or differences in wiring delay ensuing from circuit configuration or fluctuations in manufacturing, a semiconductor integrated circuit apparatus and a differential signal transmission system in a next generation digital interface typically represented by P1394b or the like. It is also made possible to provide a signal detection apparatus, a signal detection method, a signal transmission system and a computer-readable program capable of realizing detection of input signals transmitted at high data transfer speed without large current consumption and at low cost.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalent.

What is claimed is:

1. A signal detection apparatus comprising:
    a level detection unit detecting a voltage amplitude level of input signals;
    a state transition detection unit detecting any state transition in the output signals of the level detection unit;
    a signal confirmation unit issuing a notification signal when the state transition detection unit has detected state transitions a prescribed number of times during a first prescribed length of time;
    a non-signal confirmation unit issuing a notification signal when the state transition detection unit has detected no state transition during a second prescribed length of time; and
    a detect signal generation unit generating a detect signal that is validated by the signal confirmation unit and invalidated by the non-signal confirmation unit.

2. The signal detection apparatus as claimed in claim 1, wherein:
    the level detection unit has a comparator comparing the voltage amplitude level of the input signal with a prescribed voltage.

3. The signal detection apparatus as claimed in claim 1, wherein:
    the output signals of the level detection unit are logic signals; and
    the state transition detection unit, the signal confirmation unit, the non-signal confirmation unit, and the detect signal generation unit are configured of logic circuits.

4. The signal detection apparatus as claimed in claim 1, wherein:
    the state transition detection unit detects as a state transition, an output signal supplied from the level detection unit in a prescribed combination of the input signals.

5. The signal detection apparatus as claimed in claim 1, wherein:
    the state transition is detected on the basis of the transition of the voltage amplitude level of the input signals at one of above a prescribed voltage and below a prescribed voltage.

6. The signal detection apparatus as claimed in claim 5, wherein:
    the state transition is the transition of the voltage of the output signals of the level detection unit.

7. The signal detection apparatus as claimed in claim 1, wherein the signal confirmation unit comprises:
    a first time counter of which start of counting the first prescribed length of time is triggered by a first output signal from the state transition detection unit; and
    a detector detecting, during the period of time counting by the first time counter, output signals of the prescribed number of times following the first output signal from the state transition detection unit.

8. The signal detection apparatus as claimed in claim 1, wherein the non-signal confirmation unit comprises:
    a second time counter of which start of counting the second prescribed length of time is triggered by an output signal from the state transition detection unit.

9. The signal detection apparatus, as claimed in claim 1, wherein the detect signal generation unit comprises:
    a flip flop of which setting signal is the notification signal from the signal confirmation unit and of which resetting signal is the notification signal from the non-signal confirmation unit.

10. A signal detection method, comprising:
    a level detection operation of detecting the voltage amplitude level of input signals;
    a state transition detection operation of detecting any state transition in the input signals detected at the level detection operation;
    a signal confirmation operation of notifying the detection of the state transitions a prescribed number of times during a first prescribed length of time at the state transition detection operation;
    a non-signal confirmation operation of notifying the failure to detect the state transition during a second prescribed length of time at the state transition detection operation; and
    a detect signal generation operation of generating a detect signal that is validated at the signal confirmation operation and invalidated at the non-signal confirmation operation.

11. The signal detection method as claimed in claim 10, wherein:
    the level detection operation includes a comparing operation of comparing the voltage amplitude level of the input signal with a prescribed voltage.

12. The signal detection method as claimed in claim 10, wherein:
    at the state transition detection operation, when the input signals are entered in a prescribed combination, the input signals detected at the level detection operation are detected as state transition.

13. The signal detection method as claimed in claim 10, wherein:
    at the state transition detection operation, the state transition is detected on the basis of the transition of the voltage amplitude level of the input signals at one of above a prescribed voltage and below a prescribed voltage.

14. The signal detection method as claimed in claim 10, wherein the signal confirmation operation comprises:
    a first time counting operation of which start of counting the first prescribed length of time is triggered by a first transition of the input signals detected at the state transition detection operation; and
    a detection operation at which, during the period of time counting at the first time counting operation, the state transitions of following the input signals detected at the state transition detection operation are detected the prescribed number of times.

15. The signal detection method as claimed in claim 10, wherein:
    the non-signal confirmation operation has a second time counting operation of which start of counting the second prescribed length of time is triggered by the state transition of the input signals detected at the state transition detection operation.

16. A signal transmission system comprising:

a serial bus; and a signal detection apparatus comprising
- a level detection unit, connected on the serial bus, and detecting the voltage amplitude level of input signals from the serial bus,
- a state transition detection unit detecting any state transition in the output signals of the level detection unit,
- a signal confirmation unit issuing a notification signal when the state transition detection unit has detected the state transitions a prescribed number of times during a first prescribed length of time,
- a non-signal confirmation unit issuing a notification signal when the state transition detection unit has detected no state transition during a second prescribed length of time, and
- a detect signal generation unit generating a detect signal that is validated by the signal confirmation unit and invalidated by the non-signal confirmation unit, wherein the signal transmission system transmits signals by detection signals on a serial bus by the signal detection apparatus.

17. The signal transmission system, as claimed in claim 16, wherein:

the serial bus is a bus one of meeting and compliant with, the P1394b standard.

18. A signal transmission system for transmitting signals by detection signals on a serial bus by a signal detection method comprising:

a level detection operation of detecting the voltage amplitude level of input signals on the serial bus;

a state transition detection operation of detecting any state transition in the input signals detected at the level detection operation;

a signal confirmation operation of notifying the detection of the state transitions a prescribed number of times during a first prescribed length of time at the state transition detection operation;

a non-signal confirmation operation of notifying the failure to detect the state transition during a second prescribed length of time at the state transition detection operation; and a detect signal generation operation of generating a detect signal that is validated at the signal confirmation operation and invalidated at the non-signal confirmation operation.

19. The signal transmission system, as claimed in claim 18, wherein:

the serial bus is a bus one of meeting and compliant with, the P1394b standard.

20. A computer-readable program to execute signal transmission on a serial bus by an input signal detection method, the computer-readable program comprising:

a first set of instructions for a level detection operation of detecting the voltage amplitude level of input signals;

a second set of instructions for a state transition detection operation of detecting any state transition in the input signals detected at the level detection operation;

a third set of instructions for a signal confirmation operation of notifying the detection of the state transitions a prescribed number of times during a first prescribed length of time at the state transition detection operation;

a fourth set of instructions for a non-signal confirmation operation of notifying the failure to detect the state transition during a second prescribed length of time at the state transition detection operation; and a fifth set of instructions of a detect signal generation operation of generating a detect signal that is validated at the signal confirmation operation and invalidated at the non-signal confirmation operation.

* * * * *

UNITED STATES PATENT AND TRADEMARK OFFICE
CERTIFICATE OF CORRECTION

PATENT NO. : 6,885,221 B2
DATED : April 26, 2005
INVENTOR(S) : Hideaki Watanabe

It is certified that error appears in the above-identified patent and that said Letters Patent is hereby corrected as shown below:

Title page,
Item [57], ABSTRACT,
Line 5, after "PMOS" delete ".".

Signed and Sealed this

Twenty-ninth Day of November, 2005

JON W. DUDAS
*Director of the United States Patent and Trademark Office*